United States Patent
Chen et al.

(10) Patent No.: US 11,901,410 B2
(45) Date of Patent: Feb. 13, 2024

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Yen-Ting Chen, Taichung (TW); Po-Shao Lin, Hsinchu (TW); Wei-Yang Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 234 days.

(21) Appl. No.: 17/462,350

(22) Filed: Aug. 31, 2021

(65) Prior Publication Data

US 2023/0063463 A1 Mar. 2, 2023

(51) Int. Cl.
*H01L 29/06* (2006.01)
*H01L 29/66* (2006.01)
(Continued)

(52) U.S. Cl.
CPC .. *H01L 29/0673* (2013.01); *H01L 21/823418* (2013.01); *H01L 21/823431* (2013.01);
(Continued)

(58) Field of Classification Search
CPC ......... H01L 21/02603; H01L 21/28141; H01L 21/823418; H01L 21/823431; H01L 21/823821; H01L 21/845; H01L 27/0886; H01L 27/0924; H01L 27/1211; H01L 29/0649; H01L 29/0653; H01L 29/0665; H01L 29/0669; H01L 29/0673; H01L 29/0843; H01L 29/41791; H01L 29/66439; H01L 29/6653; H01L 29/66553; H01L 29/6656; H01L 29/66636; H01L 29/66795; H01L 29/775; H01L 29/7848;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — David C Spalla
(74) *Attorney, Agent, or Firm* — Slater Matsil, LLP

(57) ABSTRACT

Semiconductor devices and methods of fabrication are described herein. The method includes steps for patterning fins in a multilayer stack and forming an opening in a fin and into a substrate as an initial step in forming a source/drain region. A first semiconductor material is epitaxially grown from channels exposed along sidewalls of the opening to form first source/drain structures. A second semiconductor material is epitaxially grown from the first semiconductor material to form a second source/drain structure over and to fill a space between the first source/drain structures. A bottom of the second source/drain structure is located below a bottommost surface of the first source/drain structures. The second semiconductor material has a greater concentration percentage by volume of germanium than the first semiconductor material. A stack of nanostructures is formed by removing sacrificial layers of the multilayer stack, the second semiconductor material being electrically coupled to the nanostructures.

20 Claims, 12 Drawing Sheets

(51) Int. Cl.
  *H01L 29/08*     (2006.01)
  *H01L 21/8234*   (2006.01)
  *H01L 29/78*     (2006.01)

(52) U.S. Cl.
  CPC ...... *H01L 29/0649* (2013.01); *H01L 29/0843* (2013.01); *H01L 29/66553* (2013.01); *H01L 29/66795* (2013.01); *H01L 29/7851* (2013.01)

(58) Field of Classification Search
  CPC .............. H01L 29/785; H01L 29/7851; H01L 29/7853; H01L 29/7855; H01L 29/78618; H01L 2029/7858
  See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0051981 A1* | 2/2020 | Yang | H01L 21/02603 |
| 2020/0279918 A1* | 9/2020 | Wu | H01L 29/0673 |
| 2020/0303502 A1* | 9/2020 | Bomberger | H01L 29/775 |
| 2020/0365692 A1* | 11/2020 | Jung | H01L 29/785 |
| 2021/0265348 A1* | 8/2021 | Xie | H01L 29/0847 |
| 2023/0064735 A1 | 3/2023 | Lee et al. | |

\* cited by examiner

SEMICONDUCTOR DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
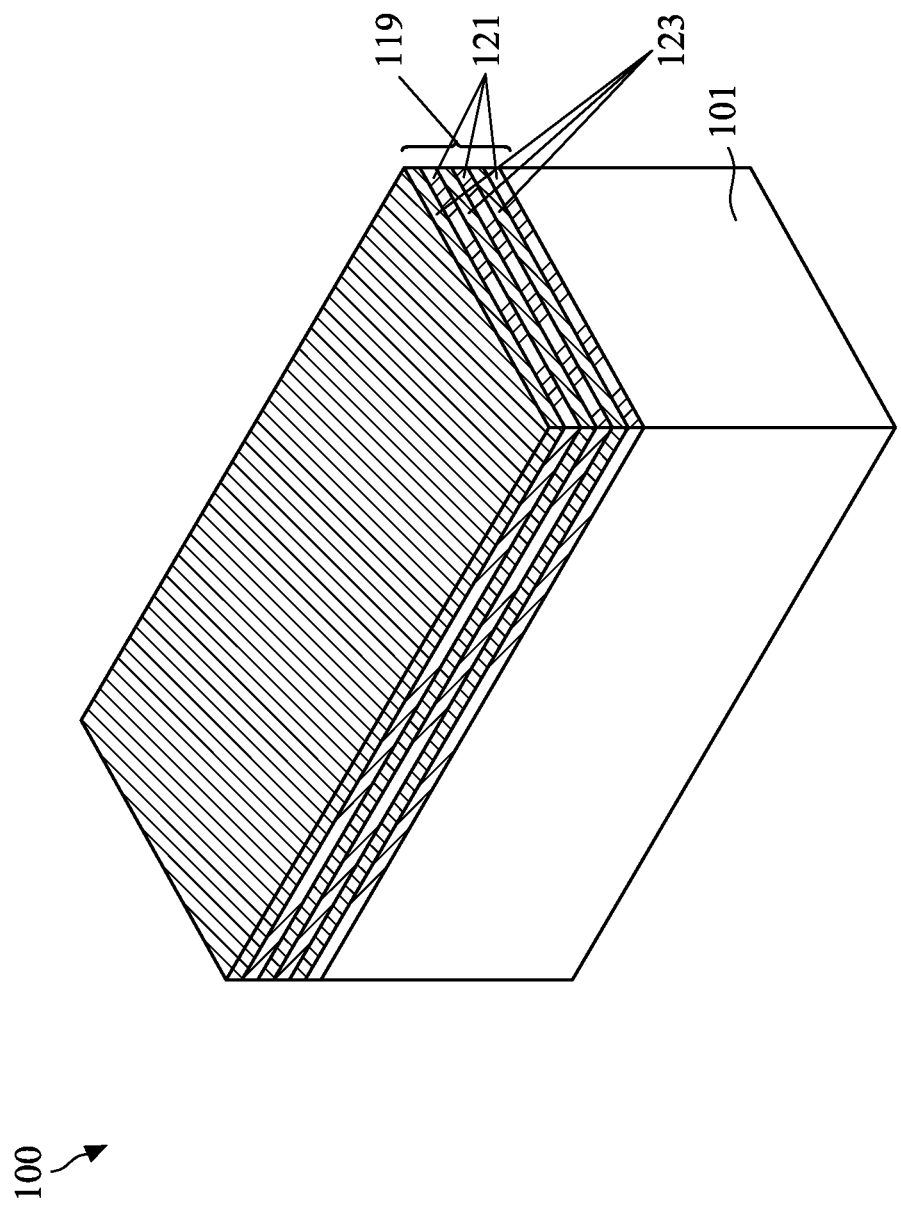
FIG. 1 illustrates, in a perspective view, a multilayer structure used to form a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which form multiple active components including multiple nanostructure devices. However, the embodiments described are intended to be illustrative and are not intended to be limited to those embodiments that are expressly described herein. Rather, the ideas presented herein may be incorporated into a wide variety of embodiments.

With reference now to FIG. 1, there is shown in a perspective view a multi-layer structure 100 comprising a substrate 101 with a multilayer stack 119 of semiconductor materials formed over the substrate 101. The substrate 101 may be a silicon substrate, although other substrates, such as semiconductor-on-insulator (SOI), strained SOI, and silicon germanium on insulator, could be used. The substrate 101 may be an n-type semiconductor, although in other embodiments, it could be a p-type semiconductor. In some embodiments, the substrate 101 may comprise doped regions (e.g., n-type regions, p-type regions, anti-punch through doped regions, combinations, or the like).

The multilayer stack 119 of semiconductor materials is formed through a series of depositions of alternating materials. In some embodiments, the multilayer stack 119 comprises first layers 121 of a first semiconductor material and second layers 123 of a second semiconductor material.

According to some embodiments, the first layers 121 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 121 of the first semiconductor material (e.g., SiGe) is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), combinations, or the like, may also be utilized. Once deposited, an optional planarization technique (e.g., chemical mechanical planarization (CMP)) may be performed to reduce a thickness of the first layer 121 to a desired thickness, according to some embodiments. In some embodiments, the first layer 121 is formed to first thicknesses of between about 30 Å and about 300 Å. However, any suitable thickness may be utilized while remaining within the scope of the embodiments.

Once the first layer 121 has been formed over the substrate 101, one of the second layers 123 may be formed over the first layer 121. According to some embodiments, the second layers 123 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 121. In a particular embodiment in which the first layer 121 is silicon germanium (SiGe), the second layer 123 is a material such as silicon (Si). However, any suitable combination of materials may be utilized for the first layers 121 and the second layers 123.

In some embodiments, the second layer 123 is epitaxially grown on the first layer 121 using a deposition technique similar to that used to form the first layer 121. Once grown, an optional planarization technique (e.g., chemical mechanical planarization (CMP)) may be performed to reduce a thickness of the second layer 123 to a desired thickness, according to some embodiments. However, the second layer 123 may use any of the deposition and/or optional planarization techniques suitable for forming the first layer 121, as set forth above or any other suitable techniques. According to some embodiments, the second layer 123 is formed to a similar thickness to that of the first layer 121. However, the second layer 123 may also be formed to a thickness that is different from the first layer 121. According to some embodiments, the second layer 123 may be formed to a second thickness of between about 10 Å and about 500 Å. However, any suitable thickness may be used.

Once the second layer 123 has been formed over the first layer 121, the deposition process is repeated to form the remaining material layers in the series of alternating materials of the first layers 121 and the second layers 123 until a desired topmost layer of the multilayer stack 119 has been formed. According to the present embodiment, the first layers 121 may be formed to a same or similar first thickness and the second layers 123 may be formed to the same or similar second thickness. However, the first layers 121 may have different thicknesses from one another and/or the second layers 123 may have different thicknesses from one another and any combination of thicknesses may be used for the first layers 121 and the second layers 123.

Although embodiments are disclosed herein comprising three of the first layers 121 and three of the second layers 123, the multilayer stack 119 may have any suitable number of layers. For example, the multilayer stack 119 may comprise a number of layers in a range between 2 to 20 layers. In some embodiments, the multilayer stack 119 may comprise equal numbers of the first layers 121 to the second layers 123; however, in other embodiments, the number of the first layers 121 may be different from the number of the second layers 123. Furthermore, the multilayer stack 119 may be formed over the substrate to any desired height.

As one of ordinary skill in the art will recognize, the process described above to form the multi-layer structure 100 is merely one potential process, and is not meant to be the only embodiment. Rather, any suitable process through which the multi-layer structure 100 may be formed may be utilized and any suitable process, including any number of deposition and optional planarization steps may be used.

Figure 2:
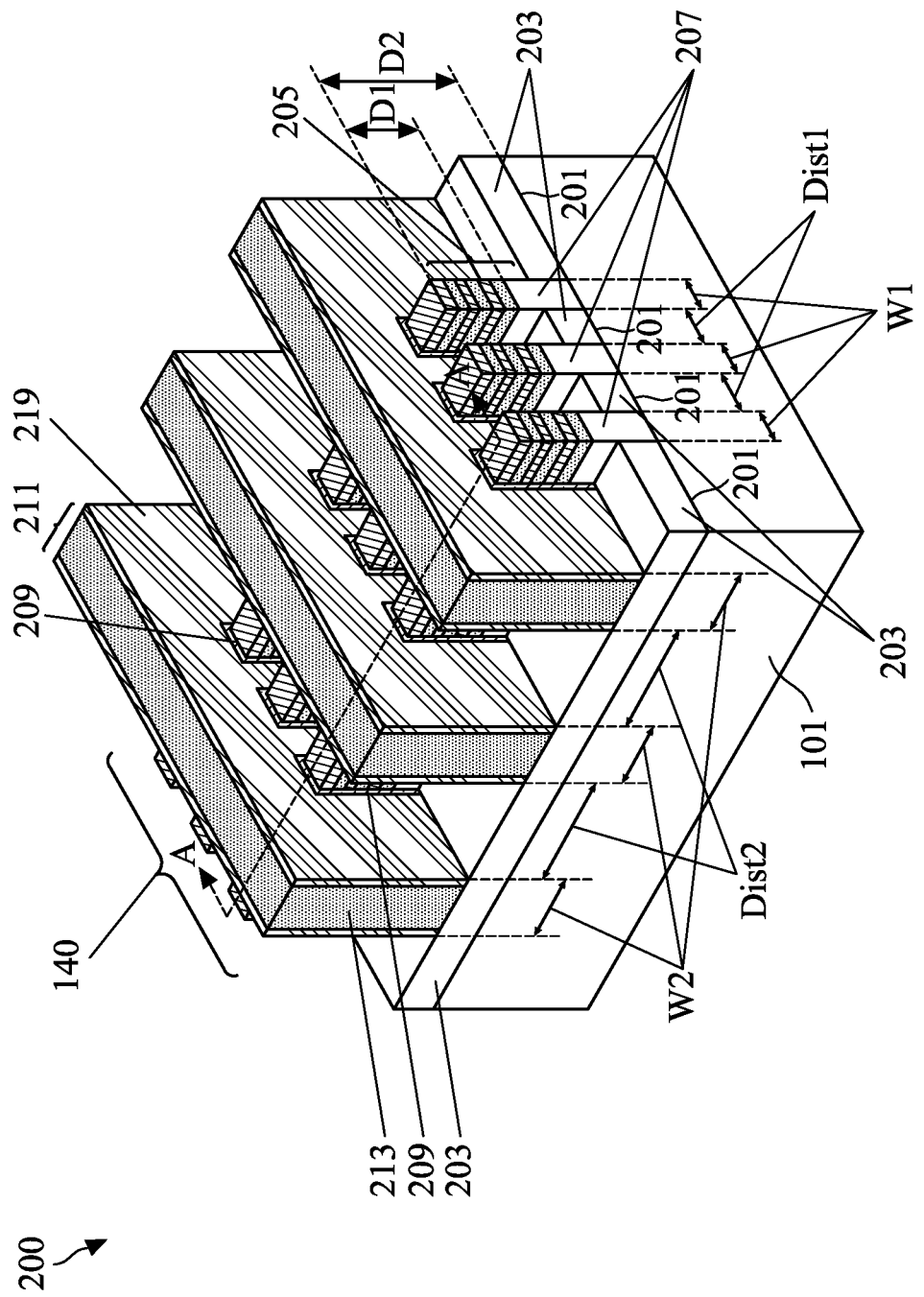
FIG. 2 illustrates a perspective view of an intermediate structure formed as an intermediate step in forming the semiconductor device, in accordance with some embodiments.

FIG. 2 illustrates a perspective view of an intermediate structure 200 formed using the multi-layer structure 100, in accordance with some embodiments. In particular, FIG. 2 illustrates the formation of trenches 201, patterned multi-layer stacks 205, and fins 207 in the multi-layer structure 100. FIG. 2 further illustrates the formation of isolation regions 203 between the fins 207, and the formation of dummy gate stacks 211 and spacers 219 over the isolation regions 203, the patterned multilayer stacks 205 and the fins 207, in accordance with some embodiments.

Once the multi-layer structure 100 has been formed, the trenches 201 are formed in the multi-layer structure 100 as an initial step in the eventual formation of isolation regions 203. The trenches 201 may be formed using a masking layer (not separately illustrated in FIG. 2) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the multi-layer structure 100 that will be removed to form the trenches 201.

As one of skill in the art will recognize, however, the processes and materials described above to form the masking layer are not the only method that may be used to protect portions of the multi-layer structure 100 while exposing other portions of the multi-layer structure 100 for the formation of the trenches. Any suitable process, such as a patterned and developed photoresist, may be utilized to expose portions of the multi-layer structure 100 to be removed to form the trenches 201. All such methods are fully intended to be included in the scope of the present embodiments.

Once a masking layer has been formed and patterned, the trenches 201 are formed in the multi-layer structure 100. The exposed materials of the exposed portions of the multi-layer structure 100 may be removed through suitable processes such as one or more reactive ion etches (RIE) in order to form the trenches 201 in the multi-layer structure 100, although any suitable process may be used. According to some embodiments, the trenches 201 may be patterned into the multi-layer structure 100 to a first depth D1 by removing portions of the first layers 121 and the second layers 123. According to some embodiments, the first depth D1 is between about 5 nm and about 150 nm. However, any suitable depths may be utilized. The trenches 201 are further patterned into the multilayer structure 100 to a second depth D2 by removing portions of the substrate 101. According to some embodiments, the second depth D2 is between about 18 nm and about 200 nm. However, any suitable depths may be utilized.

However, as one of ordinary skill in the art will recognize, the process described above to form the trenches 201 is merely one potential process, and is not meant to be the only embodiment. Rather, any suitable process through which the trenches 201 may be formed may be utilized and any suitable process, including any number of masking and removal steps may be used.

In addition to forming the trenches 201, the masking and etching process additionally forms a plurality of the patterned multilayer stacks 205 overlying a plurality of the fins 207 from those portions of the multilayer stack 119 and substrate 101 that remain unremoved. The patterned multilayer stacks 205 and the fins 207 may be collectively referred to herein as "multilayer fins." For convenience, the fins 207 have been illustrated in the figures as being separated from the substrate 101 by a dashed line, although a physical indication of the separation may or may not be present. These patterned multilayer stacks 205 overlying the fins 207 may be used, as discussed below, to form active components, such as multi-channel devices (e.g., gate-all-around (GAA) metal-oxide-semiconductor field effect transistor (MOSFET), nanosheet field effect transistors (NSFETs), or the like). While FIG. 2 illustrates three of the multilayer fins, any number of the multilayer fins may be formed in the multi-layer structure 100.

According to some embodiments, the fins 207 may be formed to have a first width $W_1$ at the surface of the substrate 101 of between about 30 Å and about 5000 Å, according to some embodiments. Furthermore, the fins 207 may be formed spaced apart by a first distance Dist1 of between about 5 nm and about 100 nm. However, any suitable widths and distances may be utilized. According to some embodiments, the first width W1 of the fins 207 and/or the patterned multilayer stacks 205 may be selected according to a desired channel width of a desired multi-channel device being formed. In some embodiments, the first distance Dist1 between the multilayer fins may be close enough to share a common gate electrode or so-called "shared gate electrode."

Furthermore, while a particular embodiment has been described above to form the patterned multilayer stacks 205 overlying the fins 207 in the multi-layer structure 100, these descriptions are intended to be illustrative and are not intended to be limiting. Rather, the patterned multilayer stacks 205 and the fins 207 may be patterned by any suitable method. As another example, the patterned multilayer stacks 205 and the fins 207 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the multi-layer structure 100 and patterned using a photolithography process. Spacers are formed alongside the patterned sacrificial layer using a self-aligned process. The sacrificial layer is then removed, and the remaining spacers may then be used to pattern the patterned multilayer stacks 205 overlying the fins 207. Any suitable process may be utilized.

In an embodiment the isolation regions 203 are formed as shallow trench isolation (STI) regions by initially depositing a dielectric material in the trenches 201. According to some embodiments, the dielectric material used to form the isolation regions 203 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the patterned multilayer stacks 205 and the fins 207. In some embodiments, a post placement anneal process (e.g., oxide densification) is performed to densify the material of the isolation regions 203 and to reduce its wet etch rate. Furthermore one or more planarization processes such as chemical mechanical polishing (CMP), etches, combinations, or the like may be performed to remove any excess material of the isolation regions 203.

Once the dielectric material has been deposited to fill or overfill the regions around the fins 207 and the patterned multilayer stack 205, the dielectric material may then be recessed to form the isolation regions 203. The recessing may be performed to expose at least a portion of the sidewalls of the fins 207. The dielectric material may be recessed using a wet etch by dipping the structure into an etchant selective to the material of the dielectric material, although other methods, such as a reactive ion etch, a dry etch, chemical oxide removal, or dry chemical clean may be used.

FIG. 2 further illustrates the formation of a dummy gate dielectric 209 over the patterned multilayer stacks 205 and the portions of the fins 207 exposed above the isolation regions 203. The dummy gate dielectric 209 may be formed by thermal oxidation, chemical vapor deposition, sputtering, or any other methods known and used in the art for forming a gate dielectric. Depending on the technique of gate dielectric formation, the dummy gate dielectric 209 thickness on the top may be different from the dummy dielectric thickness on the sidewall. In some embodiments, the dummy gate dielectric 209 may be formed by depositing a material such as silicon and then oxidizing or nitridizing the silicon layer in order to form a dielectric such as the silicon dioxide or silicon oxynitride. In such embodiments, the dummy gate dielectric 209 may be formed to a thickness ranging from between about 3 Å and about 100 Å. In other embodiments, the dummy gate dielectric 209 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å. Additionally, any combination of silicon dioxide, silicon oxynitride, and/or high-k materials may also be used for the dummy gate dielectric 209.

FIG. 2 further illustrates the formation of a dummy gate electrode 213 over the dummy gate dielectric 209, in accordance with some embodiments. The dummy gate dielectric 209 and the dummy gate electrode 213 are collectively referred to herein as the dummy gate stacks 211.

In some embodiments, the dummy gate electrode 213 comprises a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 213 may be deposited by chemical vapor deposition (CVD), sputter deposition, or other techniques known and used in the art for depositing conductive materials. The thickness of the dummy gate electrode 213 may be in the range of about 5 Å to about 500 Å. The top surface of the dummy gate electrode 213 may have a non-planar top surface, and may be planarized prior to patterning of the dummy gate electrode 213 or gate etch. Ions may or may not be introduced into the dummy gate electrode 213 at this point. Ions may be introduced, for example, by ion implantation techniques.

Once the dummy gate electrode 213 has been formed, the dummy gate dielectric 209 and the dummy gate electrode 213 may be patterned. In an embodiment the patterning may be performed by initially forming a first hard mask over the dummy gate electrode 213 and forming a second hard mask over the first hard mask.

According to some embodiments, the first hard mask comprises a dielectric material such as silicon oxide (SiO), silicon nitride (SiN), oxide (OX), titanium nitride (TiN), silicon oxynitride (SiON), combinations of these, or the like. The first hard mask may be formed using a process such as chemical vapor deposition, plasma enhanced chemical vapor deposition, atomic layer deposition, or the like. However, any other suitable material and method of formation may be utilized. The first hard mask may be formed to a thickness of between about 20 Å and about 3000 Å.

The second hard mask comprises a separate dielectric material from the material of the first hard mask. The second hard mask may comprise any of the materials and use any of the processes suitable for forming the first hard mask and may be formed to a same or similar thickness as the first hard mask. In embodiments where the first hard mask comprises an oxide (OX), the second hard mask may be e.g., silicon nitride (SiN). However, any suitable dielectric materials, processes and thicknesses may be used to form the second hard mask.

Once the first hard mask and the second hard mask have been formed, the first hard mask and the second hard mask may be patterned. In an embodiment the masks may be patterned by initially placing a photoresist (not individually illustrated) over the second hard mask and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying hard masks. In an embodiment the first hard mask and the second hard mask may be patterned using, e.g., one or more reactive ion etching (RIE) processes with the photoresist as a mask. The patterning process may be continued until the dummy gate electrode 213 is exposed beneath the first hard mask.

Once the first hard mask and the second hard mask have been patterned, the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask and the second hard mask have been patterned, the dummy gate electrode 213 and the dummy gate dielectric 209 may be patterned in order to form a series of the dummy gate stacks 211. In an embodiment the dummy gate electrode 213 and the dummy gate dielectric 209 are patterned using an anisotropic etching process, such as a reactive ion etch, although any suitable process may be utilized. As such, the dummy gate stacks 211 are disposed over the patterned multilayer stacks 205 and the portions of the fins 207 in desired locations of multilayer channel regions to be formed. In regions between the dummy gate stacks 211, the top surfaces and sidewalls of the patterned multilayer stacks 205, sidewalls of the fins 207, and top surfaces of the isolation regions 203 are exposed. According to some embodiments, the dummy gate stacks 211 may be formed to a second width W2 of between about 2 nm and about 200 nm and may be spaced apart from one another by a second distance Dist2 of between about 5 nm and about 100 nm. However, any suitable width and distance may be utilized. According to some embodiments, the second width W2 of the dummy gate stacks 211 may be selected according to a desired channel length of the desired multi-channel device being formed. Furthermore, although FIG. 2 illustrates three of the dummy gate stacks 211, any suitable number of dummy gate stacks 211 may be formed. For example, in some embodiments, fewer than three of the dummy gate stacks 211 such as two or one of the dummy gate stacks 211 may be formed. As a further example, in some embodiments, more than three of the dummy gate stacks 211 such as four or more of the dummy gate stacks 211 stacks may be formed.

FIG. 2 further illustrates the formation of the spacers 219. According to an embodiment, a spacer material is formed by blanket deposition on the dummy gate stacks 211 and the exposed portions of the patterned multilayer stacks 205, the fins 207, and the isolation regions 203. As such, the spacer material is deposited over the top surfaces and sidewalls of the dummy gate stacks 211 and over the top surfaces and sidewalls of the patterned multilayer stacks 205, sidewalls of the fins 207, and top surfaces of the isolation regions 203 not covered by the dummy gate stacks 211. According to some embodiments, the spacer material comprises a dielectric material and is formed using methods such as chemical vapor deposition (CVD), plasma enhanced CVD, sputter, thermal oxidation, and any other suitable methods. According to some embodiments, the spacer material comprises materials such as silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, combination thereof, or the like may be utilized.

Once formed, the spacer material may be etched in order to shape the spacers 219 on the dummy gate stacks 211 and the fins 207 to re-expose the tops of the dummy gate stacks 211, the tops and sidewalls of the patterned multilayer stacks 205, the sidewalls of the fins 207, and the tops of the isolation regions 203. According to some embodiments, the spacer material may be etched using an anisotropic etching process (e.g., a dry etching process) such as a reactive ion etching (RIE) process, an isotropic etching process (e.g., a wet etching process), combination thereof, or the like. In some embodiments, the spacer material formed over the patterned multilayer stacks 205 and the fins 207 in source/drain regions may be recessed during the etching process and/or during a subsequent etching process such that portions along the sidewalls of the patterned multilayer stacks 205 and the fins 207 in those source/drain regions are exposed.

However, while embodiments are described using a single spacer material, this is intended to be illustrative and is not intended to be limiting. Rather, any number of spacer materials and any combinations of deposition and removal processes may be used, and all such processes are fully intended to be included within the scope of the embodiments.

FIG. 2 further illustrates a cutline A-A overlying the intermediate structure 200. Cutline A-A is taken along the length of one of the fins 207 and is used in reference with the following figures and descriptions.

Figure 3:
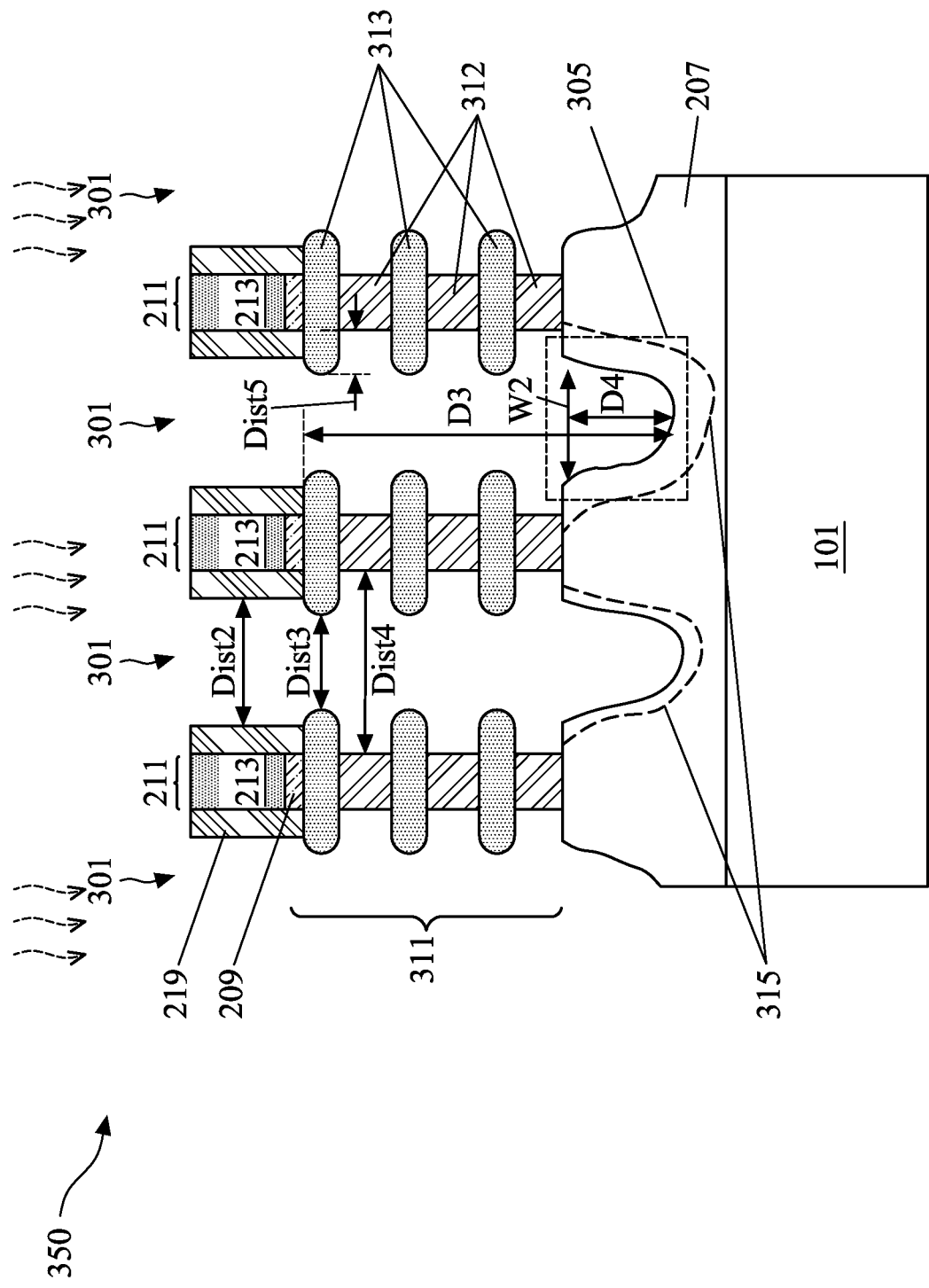
FIG. 3 illustrates a cross-sectional view of a recess etching process used in an intermediate step of forming the semiconductor device, in accordance with some embodiments.

FIG. 3 illustrates a cross-sectional view along cutline A-A of a first recess etching process 350 used in an intermediate step of forming the semiconductor device, in accordance with some embodiments. In particular, FIG. 3 illustrates the formation of first openings 301 as an initial step of forming source/drain regions of the semiconductor device, in some embodiments.

According to some embodiments, the first openings 301 may be formed by using the spacers 219 as masks and performing a first recess etching process 350 to selectively remove the materials of the patterned multilayer stacks 205, the fins 207, and/or the substrate 101 in desired locations of source/drain regions. As such the first openings 301 divide the patterned multilayer stacks 205 into a series of nanostructure stacks 311 within the multilayer channel regions underlying the dummy gate stacks 211. The nanostructure stacks 311 comprise the first layers 121 (relabeled sacrificial layers 312 in FIG. 3) and the second layers 123 (relabeled nanostructures 313 in FIG. 3).

In some embodiments, the first openings 301 also extend into n-type doped well regions and/or optional anti-punch through regions 315 that are located within the substrate 101. In embodiments of forming an active device (e.g., gate-all-around (GAA) PMOS device), the first openings 301 are extended into the substrate 101 so that the optional anti-punch through regions 315 are separated by parasitic channel regions of the fin 207.

According to some embodiments, the first recess etching process 350 may be performed using a combination and/or selective tuning of multiple anisotropic etches and/or isotropic etches to remove the materials of the second layers 123, the materials of the first layers 121, and materials of the fin 207. The first recess etching process 350 may be performed using anisotropic wet chemical etches, anisotropic dry etches, isotropic dry etches, combinations, or the like. The anisotropic wet chemical etches use solutions such as potassium hydroxide (KOH), tetra-methyl ammonium (TMAH) and ethylene di-amine pyrocatechol (EDP). The anisotropic dry etches use plasmas sources such as $CF_4$, $CH_3F$, HBr, $O_2$, He, Ar, combinations, or the like and are performed with a bias power. The isotropic dry etches use plasma sources such as $NF_3$, $CL_2$, $H_2$, Ar, He, combinations, or the like.

The first recess etching process 350 may be performed using a combination of etches and/or through selectively tuning such that the sacrificial layers 312 and the nanostructures 313 are shaped to desired profiles at the sidewalls of the first openings 301. According to some embodiments, nanostructures 313 may be formed with a convex round shape such that the nanostructures 313 at the sidewalls of the first openings 301 extend in a radial direction towards a centerline of the first openings 301. Furthermore, the sacrificial layers 312 may be initially formed with a profile that is substantially vertical and coterminous with the sidewalls of the first openings 301, in accordance with some embodiments.

In some embodiments, the first openings 301 may extend from the tops of the series of nanostructure stacks 311 and into the fin 207 to a third depth D3 of between about 20 nm and about 300 nm. According to some embodiments, the first openings 301 extend into the fin 207 at locations of the anti-punch through regions 315 formed in the fin 207.

The first recess etching process 350 may be performed using a combination of etches and/or through selectively tuning such the first openings 301 are shaped to desired recess profiles at the bottoms of the first openings 301. The concave rounded shape of the recess profile at the bottoms of the first openings 301 may be formed, according to some embodiments, using an anisotropic dry etch with a plasma source ($CF_4$) and a power bias. As such, the recess profile at the bottoms of the first openings 301 is formed to have the concave rounded shape with the second width W2 at the top of the fin 207 of between about 3 nm and about 100 nm and with a fourth depth D4 that extends into the fin 207 to a depth of between about 3 nm and about 100 nm. However, any suitable shapes, widths, and depths may be utilized. Although the first openings 301 are illustrated having the concave rounded shape of the recess profile, any suitable shape may be formed in the fin 207 using anisotropic wet chemical etches, anisotropic dry etches, isotropic dry etches, combinations, or the like and may be performed using any suitable process conditions (e.g., temperatures, flow rates, pressures, and/or times).

FIG. 3 further illustrates a recessing of the sacrificial layers 312, in accordance with some embodiments. In an embodiment the sacrificial layers 312 may be recessed during the formation of the first openings 301 through the first layers 121. In other embodiments, the sacrificial layers 312 are initially formed coterminous with the sidewalls of the first openings 301 and are subsequently recessed to a desired distance. In some embodiments, the recesses are formed in the sacrificial layers 312 using a wet etch with an etchant that is more selective to the material of the sacrificial layers 312 (e.g., silicon germanium (SiGe)) than the material of the nanostructures 313 (e.g., silicon (Si)) or the substrate 101 (e.g., silicon (Si)). For example, in an embodiment in which the sacrificial layers 312 are silicon germanium and the nanostructures 313 are silicon, the wet etch may use an etchant such as hydrochloric acid (HCl).

In an embodiment in which the sacrificial layers 312 are recessed after forming the first opening 301, the wet etching process may be performed using a dip process, a spray process, a spin-on process, or the like and may be performed using any suitable process temperatures (e.g., between about 400° C. and about 600° C.) and any suitable process times (e.g., between about 100 seconds and about 1000 seconds). However, any suitable process conditions and parameters may be utilized. The etching process may be continued such that recesses are formed in each of the sacrificial layers 312 to a fifth distance Dist5 of between about 2 nm and about 10 nm. However, any suitable distance may be used. In accordance with some embodiments, the distal ends of the sacrificial layers 312 are formed to have vertical profiles. However according to other embodiments, any suitable profile (e.g., facet-limited, convex, concave, or the like) may also be formed at the distal ends of the sacrificial layers 312.

However, a wet etching process is not the only process that may be utilized to recess the sacrificial layers 312. For example, in another embodiment the recessing of the sacrificial layers 312 may be performed with an isotropic dry etching process or a combination of a dry etching process and a wet etching process. Any suitable process of recessing the sacrificial layers 312 may be utilized, and all such processes are fully intended to be included within the scope of the embodiments.

According to some embodiments, the first recess etching process 350 is controlled and/or selectively tuned such that the first openings 301 are formed to have a round concave recess profile at the bottoms of the first openings 301 in the fin 207 and the nanostructures 313 having a convex round shape, and the sacrificial layers 312 having been recessed. As such, the first openings 301 are formed with a sidewall profile having a third distance Dist3 between nanostructures 313 and a fourth distance Dist4 between the sacrificial layers 312. According to some embodiments, the third distance Dist3 is a distance between about 3 nm and about 100 nm. In some embodiments, the fourth distance Dist4 is a distance between about 3 nm and about 100 nm. However, any suitable distances may be used for the third distance Dist3 and the fourth distance Dist4.

Although embodiments are illustrated with channel profiles having convex rounded shapes at distal ends of the nanostructures 313, the nanostructures 313 may be provided with any suitable shape during the first recess etching process 350. A great variety of channel profiles may be formed using anisotropic wet chemical etches, anisotropic dry etches, isotropic dry etches, combinations, or the like using the materials and by controlling the process conditions (e.g., precursors, temperatures, flow rates, pressures, bias powers, and/or times) during formation of the first openings 301. All such shapes and sizes of the nanostructures 313 are fully intended to be included within the scope of the embodiments.

Figure 4:
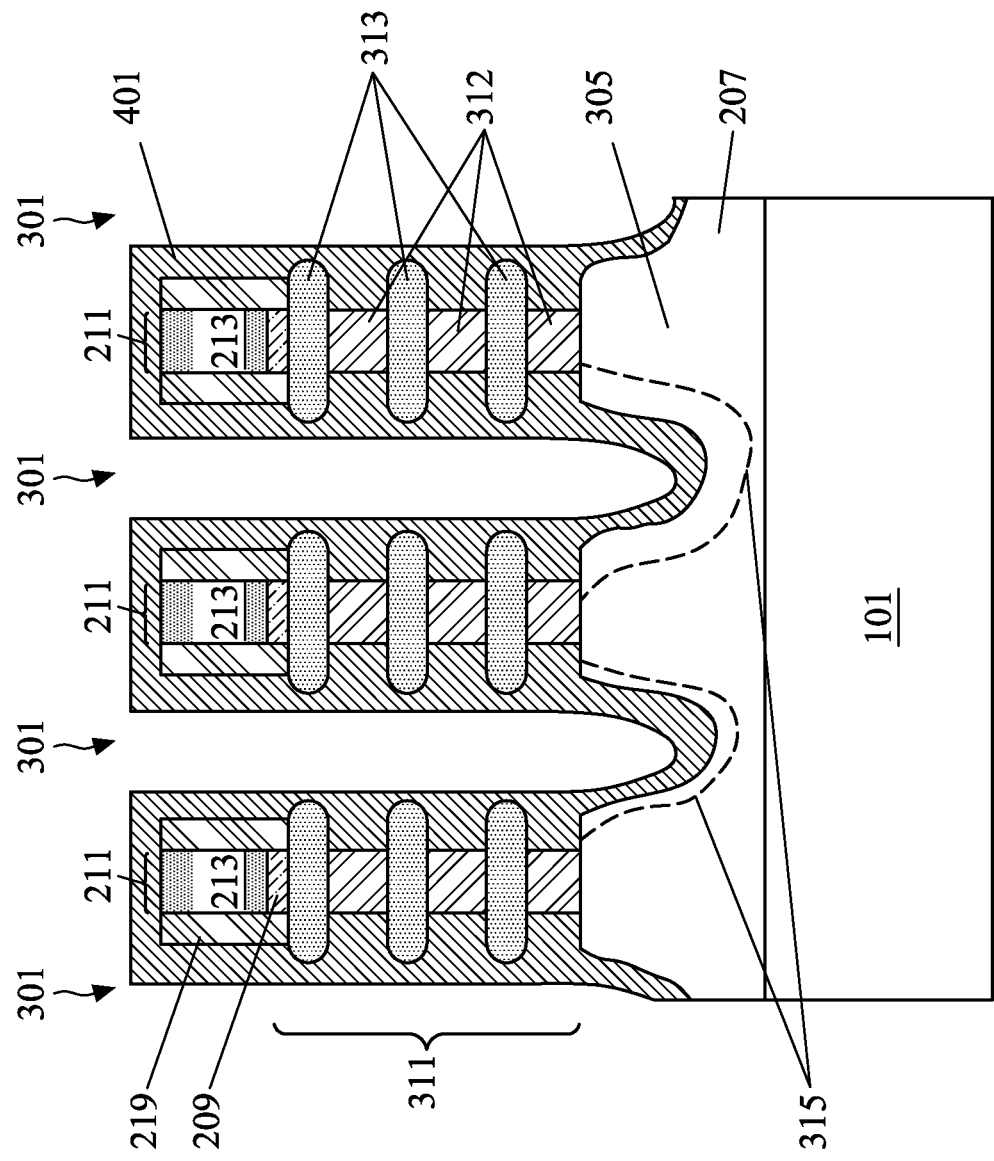
FIG. 4 illustrates a cross-sectional view of a first deposition process used in an intermediate step of forming the source/drain regions of the semiconductor device, in accordance with some embodiments.

FIG. 4 illustrates a formation of a spacer material 401 that is formed over the dummy gate stacks 211 and in the first openings 301, according to some embodiments. By depositing the spacer material 401 over the first openings 301, the spacer material 401 will line the sidewalls of the first openings 301 and will also fill in the recesses in the sacrificial layers 312. In some embodiments, the spacer material 401 can be different from the material of the spacers 219 and can be a dielectric material comprising silicon such as silicon nitride (SiN), silicon carbonitride (SiCN), silicon oxide ($SiO_2$), silicon oxynitride (SiON), silicon oxycarbonitride (SiOCN), silicon oxycarbide (SiOC), although any suitable material such as low-k materials with a k-value less than about 4.0, or combination thereof may also be utilized. The spacer material 401 may be deposited using a deposition process such as chemical vapor deposition, physical vapor deposition, or atomic layer deposition to a thickness of between about 2 nm and about 10 nm. However, any suitable thickness or deposition process may be utilized.

Figure 5:
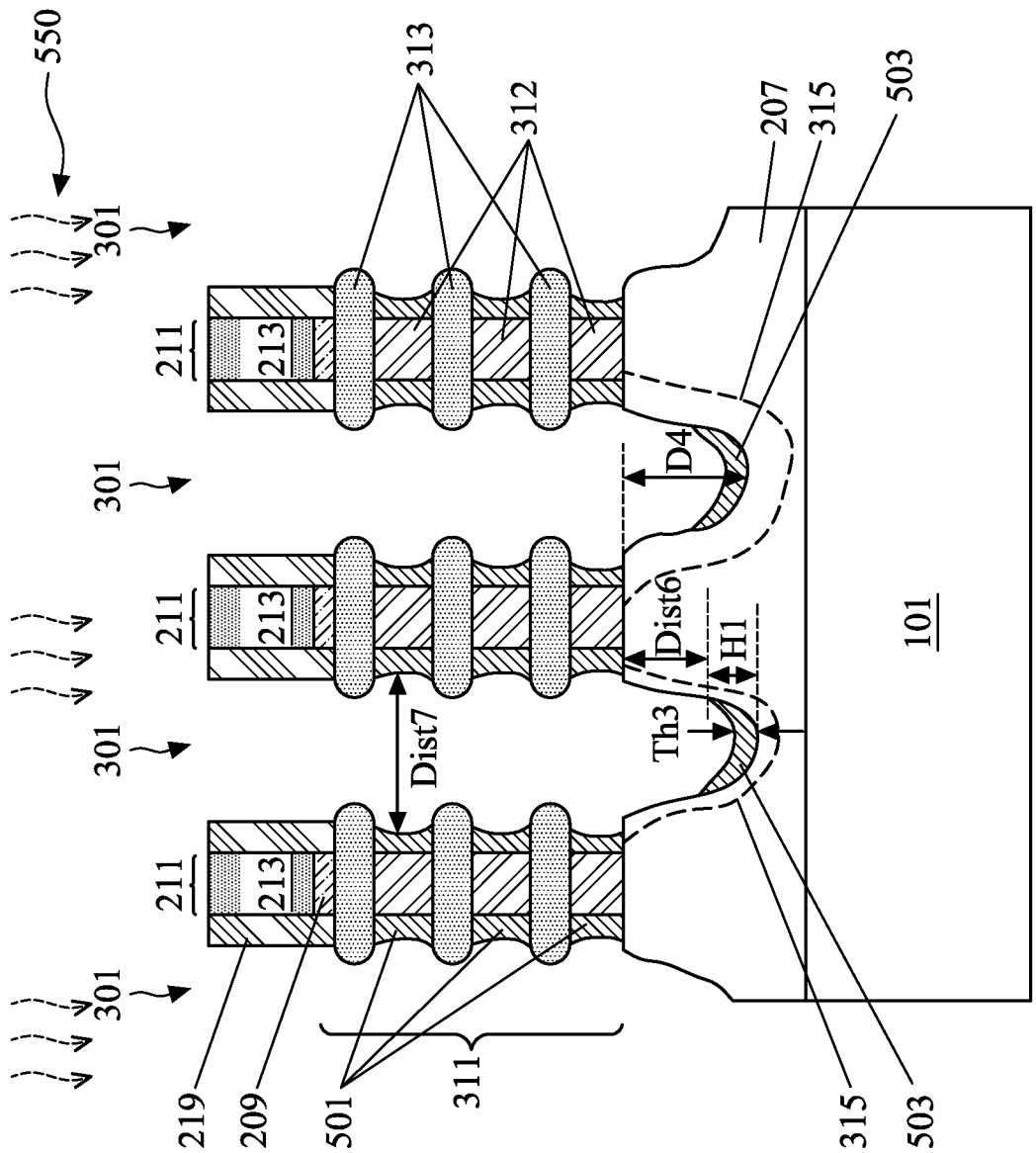
FIG. 5 illustrates a cross-sectional view of a recess removal process used in an intermediate step of forming the source/drain regions of the semiconductor device, according to some embodiments.

FIG. 5 illustrates a recess removal process 550 used in a formation of inner spacers 501 and bottom S/D spacers 503, according to some embodiments. Once the recesses have been filled with the spacer material 401, the recess removal process 550 is then performed to remove any excess spacer material 401 from the first openings 301 and from over the dummy gate stacks 211, while leaving behind the inner spacers 501 and the bottom S/D spacers 503. In an embodiment, the recess removal process 550 may be performed using an etching process such as, e.g., an anisotropic, dry etching process such as a reactive ion etching process to remove the excess spacer material 401. However, any suitable etching process, which removes the excess spacer material 401 from the first openings 301 while leaving behind the inner spacers 501 and the bottom S/D spacers 503, may be utilized.

By removing the excess spacer material 401 from the first openings 301, the inner spacers 501 will take on the shape of the recesses in the sacrificial layers 312 and the bottom S/D spacers 503 will take on the shape at the bottom of the first openings 301. Additionally, while an embodiment forming the inner spacers 501 and the bottom S/D spacers 503 to concave shapes is described, this is intended to be illustrative and is not intended to be limited. Rather, any suitable shape, such as a faceted shape or a convex shape, or even the inner spacers 501 and the bottom S/D spacers 503 having substantially flat surfaces, may be utilized. All such shapes are fully intended to be included within the scope of the embodiments.

According to some embodiments, the inner spacers 501 are formed to a width of between about 2 nm and about 10 nm and a height of between about 5 nm and about 20 nm. As such, the first openings 301 are formed with a sidewall profile having a seventh distance Dist7 between the inner spacers 501. According to some embodiments, the seventh distance Dist7 is a distance between about 3 nm and about 100 nm. However, any suitable distances may be used. The bottom S/D spacers 503 may be formed to a third thickness Th3 that is between about 10% and about 50%, such as about 20% of the fourth depth D4 between the bottom of the first openings 301 and the top of the fin 207. According to some embodiments, the third thickness Th3 may be between about 0.5 nm and about 20 nm. By forming the third thickness Th3 of the bottom S/D spacers 503 to at least about 10% of the fourth depth D4, assists in controlling the material loss and preserves a sufficient thickness of the bottom S/D spacers 503 during further processing (e.g., wet etch). By forming the third thickness Th3 of the bottom S/D spacers 503 to less than about 50% of the fourth depth D4, ensures enough space remains within the first openings 301 for the eventual epitaxial growth of source/drain materials. The epitaxial growth of the source/drain materials within the first openings 301 allows for a desired strain effect to be applied to the nanostructures 313. The bottom S/D spacers 503 may have a first height H1 that is, for example, about 20% to about 80% of the fourth depth D4. The first height H1 may be a height of between about 0.5 nm and about 50 nm, in accordance to some embodiments. By forming the bottom S/D spacers 503 to have the first height H1 that is at least about 20% of the fourth depth D4, allows for formation of a device having reduced alternating current (AC) and improved short channel effect (SCE). By forming the bottom S/D spacers 503 to less than about 80% of the fourth depth D4, allows for a portion of the fin 207 above the bottom S/D spacers 503 to be exposed for the eventual epitaxial growth of the source/drain materials from the fin 207. In some embodiments, the bottom S/D spacers 503 may be formed a sixth distance Dist6 from the top of the fin 207. The sixth distance Dist6 may be, for example, about 50% to about 90% of the fourth depth D4. Dist6 is an index for epitaxial volume control for the eventual growth of the source/drain materials. By ensuring the sixth distance Dist6 is greater than about 50% of the fourth depth D4, allows for a sufficient portion of the fin 207 to be exposed for the eventual epitaxial growth of the source/drain materials from the fin 207. By ensuring the sixth distance Dist6 is less than about 90% of the fourth depth D4, allows for improved AC performance of the device being formed. According to some embodiments, the sixth distance Dist6 is a distance of between about 1.5 nm and about 80 nm from a top of the fin 207. However, any suitable thicknesses, heights, and distances may be utilized.

Figure 6:
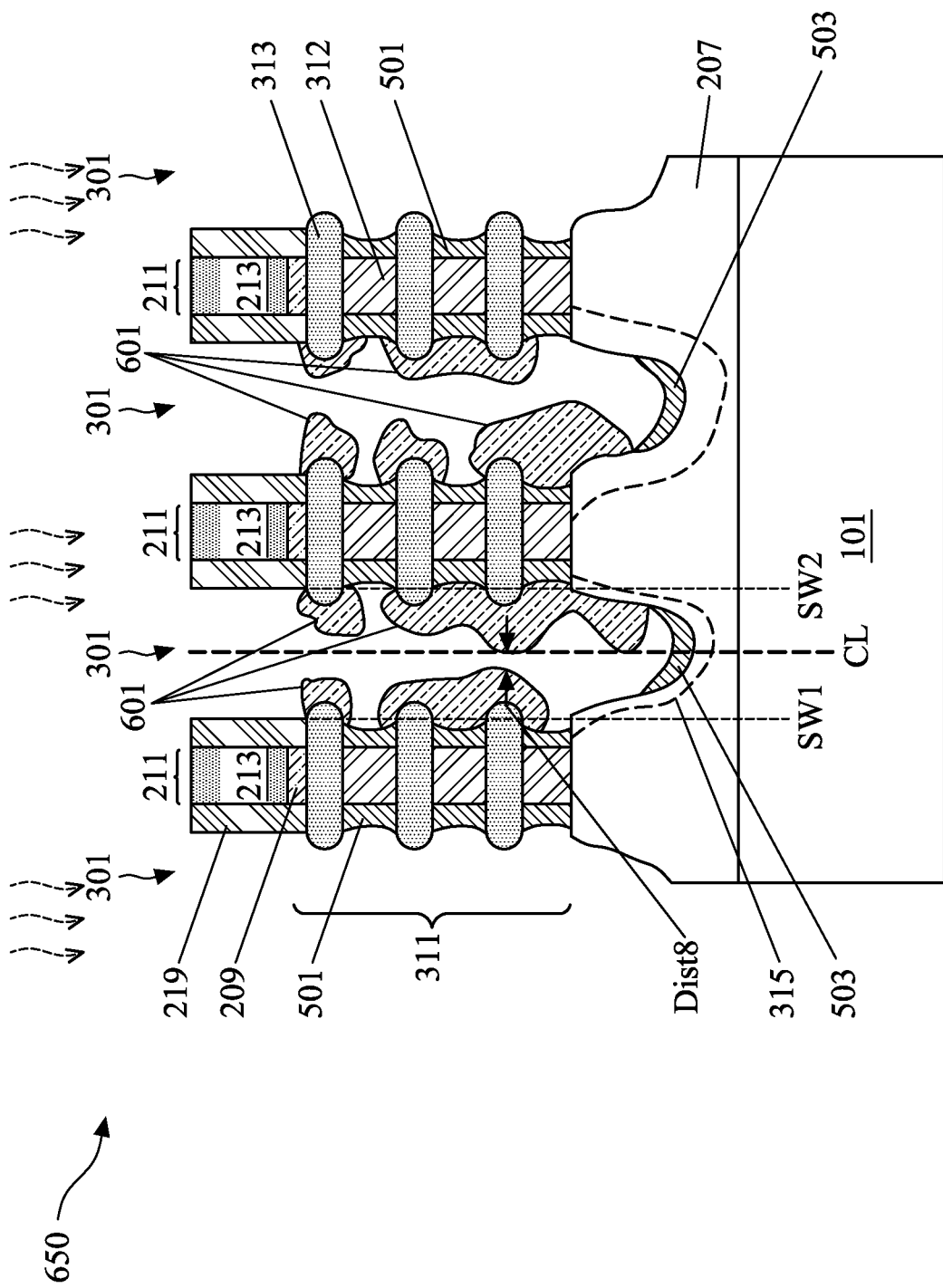
FIG. 6 illustrates a cross-sectional view of a first deposition process used in an intermediate step of forming the source/drain regions of the semiconductor device, in accordance with some embodiments.

FIG. 6 illustrates a cross-sectional view of a first deposition process 650 used in an intermediate step of forming the source/drain regions of the semiconductor device, in accordance with some embodiments. In particular, FIG. 6 illustrates the formation of first source/drain structures 601 in the first openings 301, according to some embodiments.

Once the inner spacers 501 have been formed, the first deposition process 650 is performed to form the first source/drain structures 601 along sidewalls of the first openings 301, the first source/drain structures 601 forming channel interfaces along exposed surfaces of the nanostructures 313.

According to some embodiments, the first source/drain structures 601 are formed using a deposition technique such as epitaxial growth, vapor-phase epitaxy (VPE), molecular beam epitaxy (MBE), combinations, or the like. However, any suitable deposition processes may be utilized.

For example, the first source/drain structures 601 may be formed using precursors for silicon (Si) (e.g., dichlorosilane (DCS)), other silicon precursors, or the like, and using precursors for germanium (Ge) such as germane ($GeH_4$), other germanium precursors, or the like. Additionally, if desired, other materials such as those materials suitable for shaping and/or doping the first source/drain structures 601, such as hydrochloric acid (HCl), phosphane ($PH_3$), arsane ($AsH_3$), diborane ($B_2H_6$), the like, or combinations thereof may also be used. For embodiments in which a PMOS device is being formed, the first source/drain structures 601 may be doped using a p-type dopant (e.g., boron (B)) precursor. For embodiments in which an NMOS device is being formed, the first source/drain structures 601 may be doped using an n-type dopant (e.g., phosphane ($PH_3$)) precursor. However, any suitable dopants may be used.

According to some embodiments, the first source/drain structures 601 are formed as a first concentration percentage by volume of germanium Ge $\%_1$ in a silicon germanium (SiGe) material layer. According to some embodiments, the first percentage concentration of germanium Ge $\%_1$ is within a first range of concentrations by volume where $10\% \leq$ Ge $\%_1 < 30\%$. According to some embodiments, the first concentration percentage by volume of germanium Ge $\%_1$ represents a constant concentration level of germanium (Ge) throughout the structures of the first source/drain structures 601. In other embodiments, the first percentage concentration of germanium Ge $\%_1$ represents a gradient of concentration levels of germanium (Ge) throughout the structure of the first source/drain structures 601. For example, the structure of the first source/drain structures 601 may have a concentration level gradient for which the concentration level of germanium increases as a distance from the substrate 101 increases. As such, the gradient of concentration levels of germanium (Ge) may go from 10% for materials of the first source/drain structures 601 located nearest the bottom of the first opening 301 to about 30% located nearest the top of the first opening 301. However, any suitable gradient may be used. In such embodiments, the concentration level gradient may be formed during growth by tuning one or more of flow rates of precursors used to form the first source/drain structures 601 and increase the percentage concentration of germanium during deposition.

According to some embodiments, the first source/drain structures 601 are lightly doped (e.g., a concentration by volume of between about $2 \times 10^{20}$ $cm^{-3}$ and about $3 \times 10^{20}$ $cm^{-3}$) with a p-type dopant (e.g., boron (B)). However, any suitable dopants may be utilized. According to some embodiments, the dopants of the first source/drain structures 601 may be placed during the growth of the first source/drain structures 601. For example, the dopants may be placed in situ as the first source/drain structures 601 are being formed. However, any suitable process for placing the dopants within the first source/drain structures 601 may be utilized, and all such processes are fully intended to be included within the scope of the embodiments.

Furthermore, the deposition process may be controlled such that the first source/drain structures 601 are epitaxially grown from the nanostructures 313 and along sidewalls of the first openings 301. For example, the first source/drain structures 601 may be formed and shaped along sidewalls of the first openings 301 by modifying the flow rates of the precursors and process regions used during in the deposition process.

According to some embodiments, the first deposition process 650 may be controlled such that the first source/drain structures 601 are epitaxially grown along sidewalls of the first openings 301 to form channel interfaces along exposed surfaces of the nanostructures 313. By tuning the flow rates of the precursors and process regions used in the first deposition process 650, the first source/drain structures 601 may be epitaxially grown from the exposed surfaces of the nanostructures 313 such that first source/drain structures 601 formed along one sidewall of a first opening 301 remain unmerged with the first source/drain structures 601 formed along an opposing sidewall of the first opening 301. For example, in the illustrated embodiment, the first source/drain structures 601 formed along the nanostructures 313 of a first sidewall SW1 are not merged with the first source/drain structures 601 formed along the nanostructures 313 of a second sidewall SW2. As such, the first opening 301 remains free of the first source/drain structures 601 along a centerline CL of the first opening 301.

According to some embodiments, the first source/drain structures 601 are formed with irregular rounded shapes and the first source/drain structures 601 grown from adjacent nanostructures 313 of a same sidewall (e.g., the first sidewall SW1) may merge between one another to form a single structure. However, the first source/drain structures 601 that are grown from adjacent nanostructures 313 may also remain unmerged and separate structures. For example, in the illustrated embodiment, the first source/drain structures 601 formed from the middle and bottom nanostructures 313 along the first sidewall SW1 are merged together to form a single structure and the first source/drain structures 601 formed from the top nanostructure 313 along the first sidewall SW1 remain unmerged with the other structures. Although illustrated and described herein as some of the first source/drain structures 601 being merged structures and some of the first source/drain structures 601 remaining unmerged separate structures, all of the first source/drain structures 601 formed along a same sidewall (e.g., the second sidewall SW2) may be formed as a single merged structure or may remain unmerged as separate structures. All such structures are fully intended to be included within the scope of the embodiments.

According to some embodiments, the deposition process used to form the first source/drain structures 601 may be performed using a process temperature between about 500° C. and about 800° C. In addition, the deposition process used to form the first source/drain structures 601 may be performed using a process pressure between about 5 torr and about 300 torr, in accordance with some embodiments. The gases and/or precursors may be flowed into a processing chamber at a rate between about 10 sccm and about 2000 sccm and for a period of time of between about 50 seconds and about 3000 seconds. Other deposition processes or process parameters may be used. The deposition process is continued until the first source/drain structures 601 form interfaces with the exposed surfaces of the nanostructure 313 and fill a desired volume of the first openings 301.

Figure 7:
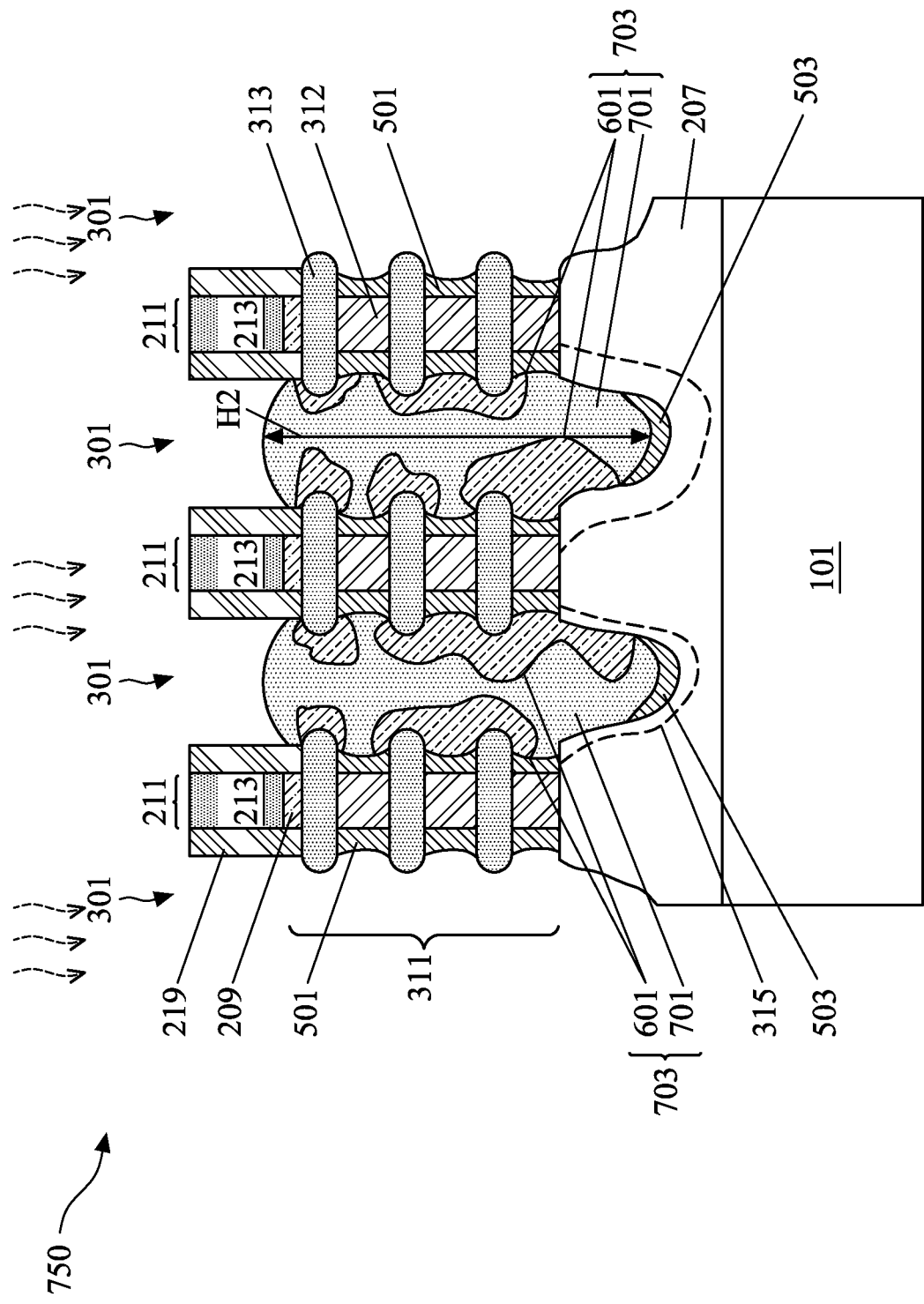
FIG. 7 illustrates a cross-sectional view of a second deposition process used in an intermediate step of forming the source/drain regions of the semiconductor device, in accordance with some embodiments.

Once deposited, an optional etching process (e.g., wet etch) may be performed to recess the first source/drain structures 601 to at least the eighth distance Dist8 between the nanostructures 313 formed along the first sidewall SW1 and the nanostructures 313 formed along the second sidewall SW2. The first source/drain structures 601 may be recessed to a distance between about 5% and about 20% of the total distance between the nanostructures 313 formed along the first sidewall SW1 and the nanostructures 313 formed along the second sidewall SW2. Recessing the first source/drain structures 601 to a distance greater than about 5% of the total distance between the nanostructures 313 ensures a graded buffer layer covers a lattice constant mismatch between the channel materials (e.g., Si) of the nanostructures 313 and the source/drain materials (e.g., SiGe) of the second source/drain structures 701 to be formed. Recessing the first source/drain structures 601 to less than about 20% of the total distance between the nanostructures 313 ensures that the eighth distance Dist8 of the gap is sufficient for the formation of second source/drain structures 701 as illustrated in FIG. 7. With a sufficient gap provided, the second source/drain structures 701 can be formed with a source/drain material (e.g., SiGe) having a second percentage concentration by volume of germanium (e.g., Ge $\%_2$). The second percentage concentration by volume of germanium (Ge $\%_2$) being a higher percentage concentration as compared with the first percentage concentration by volume of germanium (Ge $\%_1$). As such, reserving a large portion of the volume of the first openings 301 for the second source/drain structures 701 to be formed therein, allows for the formation of a device having a reduced schottky barrier height. The eighth distance Dist8 is the distance of the remaining gap between the first source/drain structures 601 which is a distance between about 10% and about 80% of the total distance. According to some embodiments, the eighth distance Dist8 is a distance between about 4 nm and about 14 nm. However, any suitable distance may be used for the eighth distance Dist8. For example, in an embodiment which the total distance between the nanostructures 313 formed along the first sidewall SW1 and the nanostructures 313 formed along the second sidewall SW2 is about 20 nm, the first source/drain structures 601 may each be recessed to a thickness of about 3 nm. The remaining gap between the first source/drain structures 601 being the eighth distance Dist8 of about 14 nm.

According to some embodiments, the optional etching process may be performed using a combination of etches to shape the first source/drain structures 601 to a desired configuration. In some embodiments, the optional etching process is used to shape the first source/drain structures 601 to be facet-limited shaped. In other embodiments, the optional etching process is used to shape the first source/drain structures 601 to be conformally shaped to the surfaces of the nanostructures 313 and/or the inner spacers 501. According to a particular embodiment in which the nanostructures 313 are formed with the convex round shape, the first source/drain structures 601 are formed with a first interface profile that is facet limited and has a convex shape extending in a radial direction from the distal ends of the nanostructures 313 towards a centerline of the first openings 301. Although illustrated and described herein as having irregular rounded shapes, the first source/drain structures 601 may be formed and optionally etched to have regular shapes, conformally shaped, facet-limited shapes, or the like. All such shapes are fully intended to be included within the scope of the embodiments.

FIG. 7 illustrates a cross-sectional view of a second deposition process 750 used in an intermediate step of forming the source/drain regions of the semiconductor device, in accordance with some embodiments. In particular, FIG. 7 illustrates the formation of the second source/drain structures 701 in the first openings 301, according to some embodiments.

Once the first source/drain structures 601 have been formed, the second deposition process 750 is performed to form the second source/drain structures 701 over the first source/drain structures 601, according to some embodiments. In some embodiments, the second source/drain structures 701 are formed using any of the deposition process and precursors for silicon (Si) and germanium (Ge) suitable for forming the first source/drain structures 601 as set forth above. According to some embodiments, the second source/drain structures 701 are formed using precursors such as DCS and germane ($GeH_4$). However, other materials such as those materials suitable for shaping and/or doping the second source/drain structures 701 such as hydrochloric acid (HCl), phosphane ($PH_3$), arsane ($AsH_3$), diborane ($B_2H_6$), the like, or combinations thereof may also be used. For embodiments in which a PMOS device is being formed, the second source/drain structures 701 may be doped using a p-type dopant (e.g., boron (B)). For embodiments in which an NMOS device is being formed, the second source/drain structures 701 may be doped using an n-type dopant (e.g., phosphane ($PH_3$)). However, other dopants may also be utilized.

According to some embodiments, the second source/drain structures 701 are formed with a second concentration percentage by volume of germanium Ge $\%_2$ in a silicon germanium (SiGe) material layer. In some embodiments, the second concentration percentage by volume of germanium Ge $\%_2$ may be within a second range of concentrations by volume where 30%≤Ge $\%_2$≤65%. According to some embodiments, the second concentration percentage by volume of germanium Ge $\%_2$ represents a constant concentration level of germanium (Ge) throughout the structures of the second source/drain structures 701. In other embodiments, the second concentration percentage of germanium Ge $\%_2$ represents a gradient of concentration levels of germanium (Ge) throughout the second source/drain structures 701. For example, the second source/drain structures 701 may have a concentration level gradient for which the concentration level of germanium increases as a distance from the substrate 101 increases. As such, the gradient of concentration levels of germanium (Ge) may go from 30% at the bottom of the second source/drain structure 701 which interfaces the first source/drain structure 601 to about 65% at the top of the second source/drain structures 701. However, any suitable gradient may be used. In such embodiments, the concentration level gradient may be formed during growth by tuning one or more of flow rates of precursors used to form the second source/drain structures 701 and increase the percentage concentration of germanium during deposition.

In some embodiments, the second source/drain structures 701 are epitaxially grown using any of the deposition techniques suitable for forming the first source/drain structure 601 (e.g., epitaxial growth, VPE, MBE, combinations, or the like). In addition, the deposition process may be conducted at a process temperature between about 400° C. and about 800° C., in accordance with some embodiments. Furthermore, the deposition process may be conducted at a process pressure of between about 1 torr and about 760 torr. However, any suitable temperature and pressure may be utilized to form the second source/drain structures 701. In some embodiments, the deposition process is controlled such that the second source/drain structures 701 is epitaxially grown from the first source/drain structures 601 to fill the remaining space within the first openings 301 to a second height H2 in a bottom-up process. According to some embodiments, the second height H2 is a height between about 3 nm and about 30 nm. However, any suitable height may be used. According to some embodiments, an upper portion of the second source/drain structures 701 may be formed with optional rounded shapes between the spacers 219. However, other optional shapes such as facet-limited shapes may also be used.

According to some embodiments, the second source/drain structures 701 is heavily doped or even more heavily doped as compared to the lightly doped materials of the first source/drain structure 601. In some embodiments, the second source/drain structures 701 are more heavily doped (e.g., a concentration by volume of between about $8\times10^{20}$ cm$^{-3}$ and about $1.2\times10^{21}$ cm$^{-3}$ with a p-type dopant (e.g., boron (B)). However, any suitable dopants may be utilized. In some embodiments, the dopant concentration of the second source/drain structures 701 is the same as the dopant concentration of the first source/drain structure 601. In some other embodiments, the dopant concentration of the second source/drain structures 701 is greater than the dopant concentration of the first source/drain structure 601.

The dopants of the second source/drain structures 701 may be placed during the growth of the second source/drain structures 701, in accordance with some embodiments. For example, the dopants may be placed in situ as the second source/drain structures 701 are epitaxially grown. In other embodiments, the dopants may be placed in the second source/drain structures 701 after formation using, for example, a suitable dopant implantation technique. However, any suitable process for placing the dopants within the second source/drain structures 701 may be utilized, and all such processes are fully intended to be included within the scope of the embodiments. Furthermore, separate anneal processes and/or a combined anneal process may be performed to activate the dopants within the first source/drain structures 601 and the second source/drain structures 701. As such, a multi-structure source/drain region 703 is formed within the first opening 301 and is ready for further processing.

According to some embodiments, the deposition and/or etching processes are controlled such that a volume of the first source/drain structures 601 is between about 5% and about 20% of a volume of the multi-structure source/drain region 703. In some embodiments, the materials of the first source/drain structures 601 may be initially formed to fill the entire volume of the first opening 301. As such, an easy process may be used in the formation of the nanostructures 313. Once the nanostructures 313 have been formed, the material of the first source/drain structures 601 may then be recessed to a desired volume leaving ample space for the materials of the second source/drain structures 701 to be deposited. By forming the first source/drain structures 601 to at least about 5% of the volume of multi-structure source/drain region 703 provides graded layer between a lattice mismatch between the materials of the nanostructures 313 (e.g., Si) and the materials to be used in the formation of the second source/drain structures 701 (e.g., SiGe). Furthermore, by restricting the volume of the first source/drain structures 601 to less than about 20%, allows for a low contact resistance of the multi-structure source/drain region 703. The deposition processes are further controlled such that a volume of the second source/drain structures 701 is between about 80% and about 95% of the volume of the multi-structure source/drain region 703. In some embodiments, the entire volume of the first opening 301 is initially filled with the materials of the first source/drain structures 601. As such, an easy process may be used in the formation of the nanostructures 313. Once the nanostructures 313 have been formed, the material of the first source/drain structures 601 may then be recessed to a desired volume leaving ample space for the materials of the second source/drain structures 701 to be deposited. By forming the second source/drain structures 701 to at least about 80% of the volume of multi-structure source/drain region 703 effectively reduces a contact resistance of the multi-structure source/drain region 703 and provides a desired strain for the channel. Furthermore, by restricting the volume of the second source/drain structures 701 to less than about 95%, allows for ample volume of the first source/drain structures 601 to provide a graded layer between a lattice mismatch between the materials of the nanostructures 313 and the materials to be used in the formation of the second source/drain structures 701. However, any suitable percentages may be used.

Figure 8:
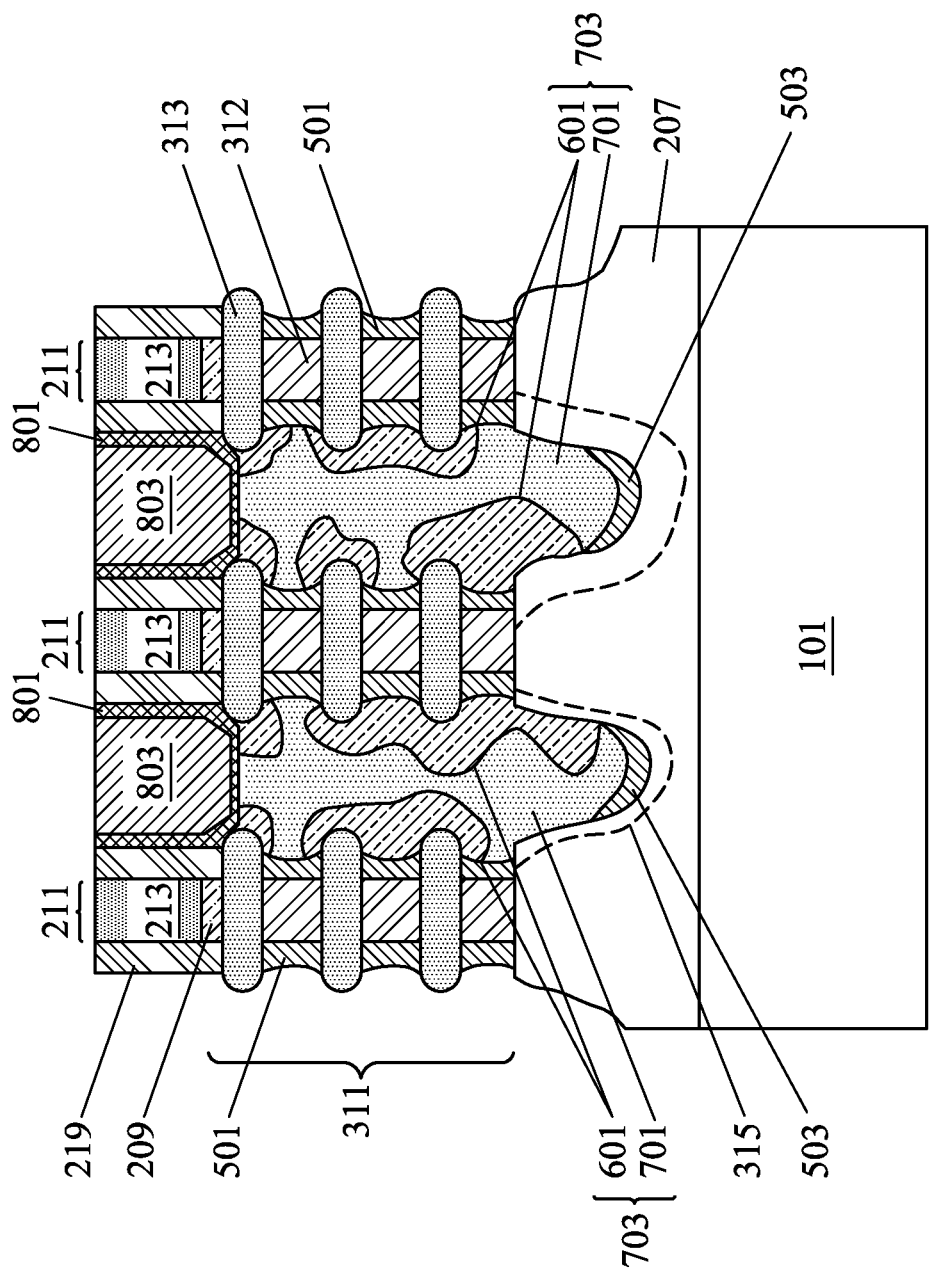
FIG. 8 illustrates a cross-sectional view of the formation of a contact etch stop layer and an interlayer dielectric layer in an intermediate step of forming the semiconductor device, in accordance with some embodiments.

FIG. 8 illustrates a cross-sectional view of an intermediate step in preparation for the eventual formation of the gate contacts and the source/drain contacts of the semiconductor device, in accordance with some embodiments. In particular, FIG. 8 illustrates the formation of a contact etch stop layer 801 and an interlayer dielectric layer 803, in accordance with some embodiments.

Once the material of the second source/drain structures 701 has been deposited, an optional etching process (e.g., wet etch) may be performed to recess and/or planarize the multi-structure source/drain regions 703. Once the multi-structure source/drain regions 703 have been formed and/or optionally recessed, the contact etch stop layer 801 is formed over the multi-structure source/drain regions 703, along sidewalls of the spacers 219, and over the top of the materials exposed on the top of the intermediate structure. The contact etch stop layer 801 functions as an etch stop layer in a subsequent etching process, and may comprise a suitable material such as silicon nitride (SiN), silicon oxynitride (SiON), silicon carbon nitride (SiCN), combinations thereof, or the like, and may be formed by a suitable formation method such as chemical vapor deposition (CVD), physical vapor deposition (PVD), combinations thereof, or the like.

The interlayer dielectric layer 803 is formed over the contact etch stop layer 801 and fills and/or overfills the remaining space in the first openings 301. The interlayer dielectric layer 803 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The interlayer dielectric layer 803 may be formed using a process such as plasma enhanced chemical vapor deposition (PECVD), although other processes, such as low pressure chemical vapor deposition (LPCVD), may also be used.

Once formed, the interlayer dielectric layer 803 and the contact etch stop layer 801 may be planarized with the dummy gate electrode 213 and spacers 219 using a planarization process such as chemical mechanical planarization (CMP). However, any suitable planarization process may be utilized. Furthermore, any remaining portions of the first hard mask and/or the second hard mask not previously removed may be removed during the planarization process of the interlayer dielectric layer 803. According to some embodiments, one or more etching processes and/or the chemical mechanical planarization (CMP) may be utilized to remove any remaining portions of the first hard mask and the second hard mask. As such, the dummy gate electrode 213 is exposed after the planarization process.

Figure 9:
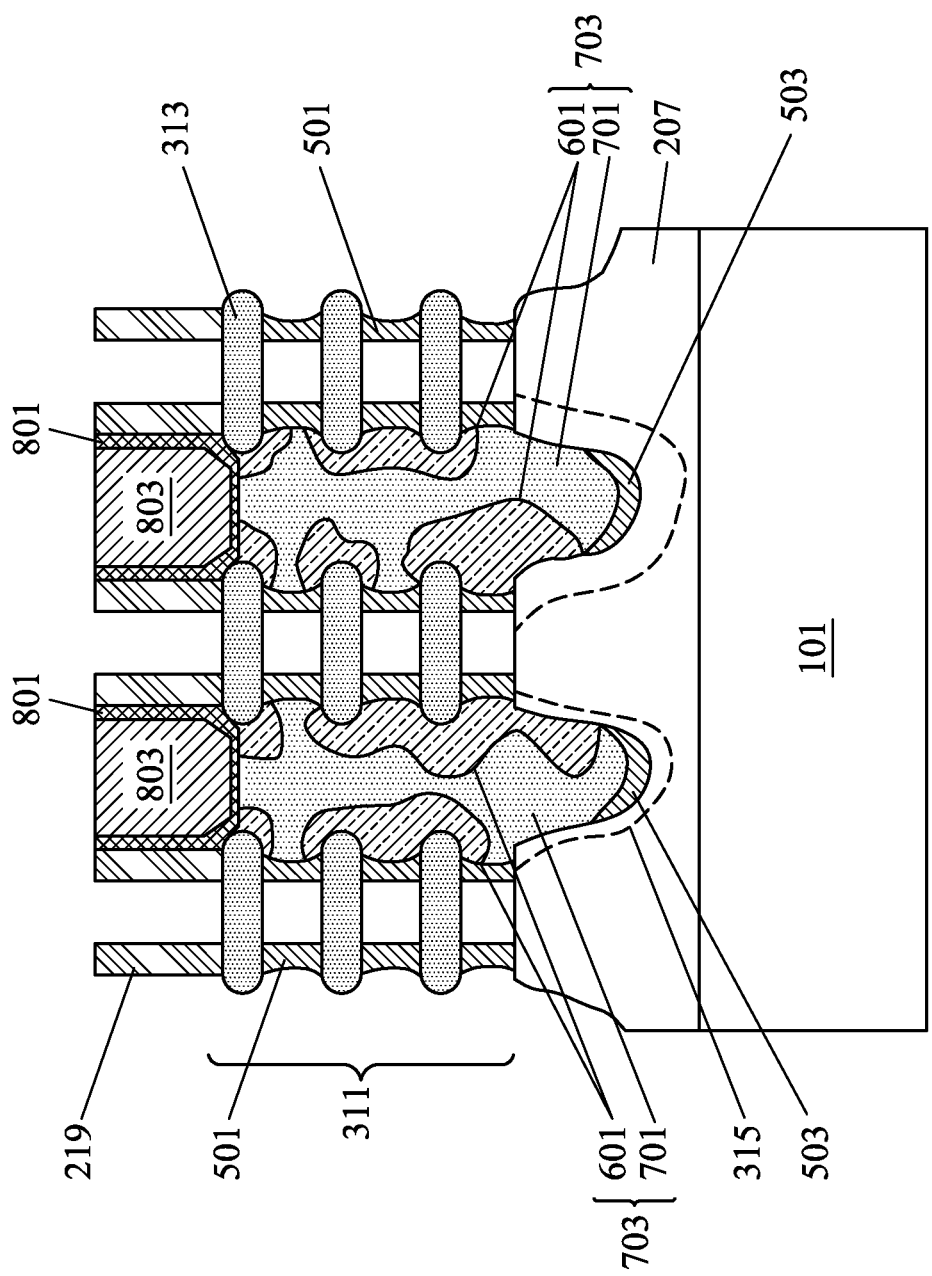
FIG. 9 illustrates a cross-sectional view of a dummy gate removal process used in an intermediate step of forming the semiconductor device, in accordance with some embodiments.

FIG. 9 illustrates a cross-sectional view of an intermediate step in forming a gate electrode of the semiconductor device, in accordance with some embodiments. In particular, FIG. 9 illustrates the removal of the dummy gate electrodes 213, the dummy gate dielectric 209, and the sacrificial layers 312 in preparation for the eventual formation of a gate electrode, in accordance with some embodiments.

Once exposed, the dummy gate electrodes 213 may be removed in order to expose the underlying dummy gate dielectric 209. In an embodiment the dummy gate electrodes 213 are removed using, e.g., one or more wet or dry etching processes that utilize etchants that are selective to the material of the dummy gate electrodes 213. However, any suitable removal process may be utilized.

Once the dummy gate dielectric 209 has been exposed, the dummy gate dielectric 209 is removed to expose the underlying multilayer channels regions in the patterned multilayer stacks 205 and the portions of the fins 207. In an embodiment the dummy gate dielectric 209 may be removed using, e.g., a wet etching process that utilizes etchants that are selective to the material of the dummy gate dielectric 209 and substantially less-selective or non-selective to the underlying materials of the nanostructures 313 and the sacrificial layers 312, although any suitable etching process may be utilized.

Once the dummy gate dielectric 209 has been removed, the sides of the sacrificial layers 312 previously covered by the dummy gate dielectric 209 are exposed. As such, the sacrificial layers 312 may be removed from between the substrate 101 and from between the nanostructures 313 in a wire release process step. The wire release process step may also be referred to as a sheet release process step, a sheet formation process step, a nanosheet formation process step or a wire formation process step. In an embodiment the sacrificial layers 312 may be removed using a wet etching process that selectively removes the material of the sacrificial layers 312 (e.g., silicon germanium (SiGe)) without significantly removing the material of the substrate 101 and the material of the nanostructures 313 (e.g., silicon (Si)). However, any suitable removal process may be utilized.

For example, in an embodiment, an etchant such as a high temperature HCl may be used to selectively remove the material of the sacrificial layers 312 (e.g., SiGe) without substantively removing the material of the substrate 101 and/or the material of the nanostructures 313 (e.g., Si). Additionally, the wet etching process may be performed at a temperature of between about 400° C. and about 600° C., and for a time of between about 100 seconds and about 600 seconds. However, any suitable etchant, process parameters, and time can be utilized.

By removing the material of the sacrificial layers 312, the sides of the nanostructures 313 are exposed. The nanostructures 313 are separated from each other by the inner spacers 501. The nanostructures 313 comprise the channel regions between opposite ones of the multi-structure source/drain regions 703 and have a channel length of between about 5 nm and about 180 nm and a channel width of between about 8 nm and about 100 nm. In an embodiment the nanostructures 313 are formed to have the same thicknesses as the original thicknesses of the second layers 123 such as, of between about 3 nm and about 15 nm, although the etching processes may also be utilized to reduce the thicknesses.

Additionally, although FIG. 9 illustrates the formation of three of the nanostructures 313 in the nanostructure stacks 311, any suitable number of the nanostructures 313 may be formed from the nanosheets provided in the multilayer stack 119. For example, the multilayer stack 119 may be formed to include any suitable number of the first layers 121 and any suitable number of the second layers 123. As such, a multilayer stack 119 comprising fewer first layers 121 and fewer second layers 123, after removal of the sacrificial layers 312, forms one or two of the nanostructures 313. Whereas, a multilayer stack 119 comprising many of the first layers 121 and many of the second layers 123, after removal of the sacrificial layers 312, forms four or more of the nanostructures 313.

Figure 10:
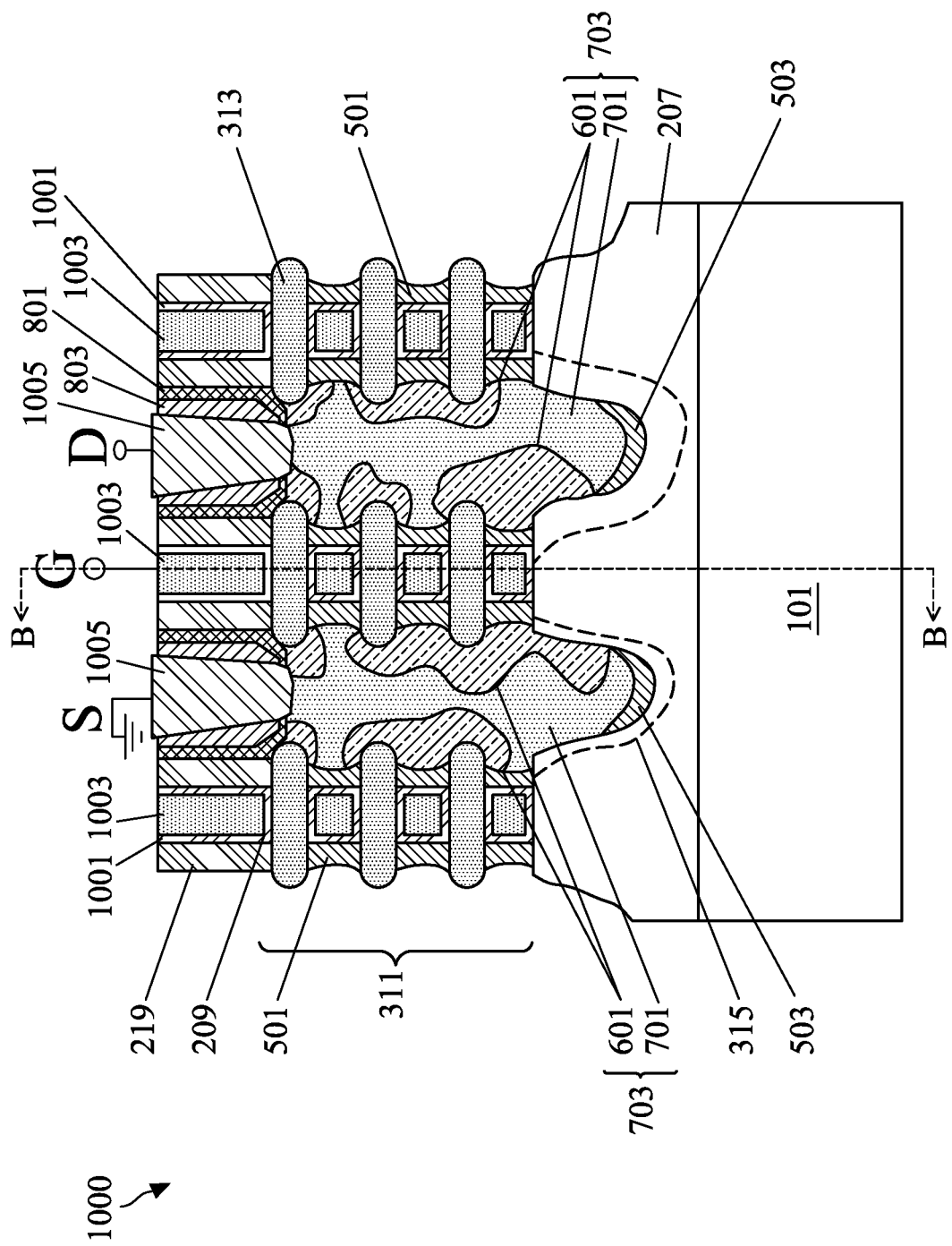
FIGS. 10 and 11 illustrate cross-sectional views of a first semiconductor device, in accordance with some embodiments.

FIG. 10 illustrates a cross-sectional view of a first semiconductor device 1000, in accordance with some embodiments. In particular, FIG. 10 illustrates the formation of a gate dielectric 1001, gate electrodes 1003, and source/drain contacts 1005 according to some embodiments.

In an embodiment the gate dielectric 1001 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 1001 comprises a nitrogen doped oxide dielectric that is initially formed prior to forming a metal content high-K (e.g., K value >13) dielectric material. The gate dielectric 1001 may be deposited to a thickness of between about 1 nm and about 3 nm, although any suitable material and thickness may be utilized. As illustrated, the gate dielectric 1001 wraps around the nanostructures 313, thus forming gate-all-around channels between the multi-structure source/drain regions 703. Furthermore, the first source/drain structures 601 between the nanostructures 313 and the second source/drain structures 701 serve as lightly doped regions of the gate-all-around channels.

Once the gate dielectric 1001 has been formed, the gate electrodes 1003 are formed to surround the nanostructures 313 and serve as gate-all-around electrodes of the first semiconductor device 1000. In some embodiments, the gate electrodes 1003 are formed using multiple layers, each layer deposited sequentially adjacent to each other using a highly conformal deposition process such as atomic layer deposition, although any suitable deposition process may be utilized. According to some embodiments, the gate electrodes 1003 may comprise a capping layer, a barrier layer, an n-metal work function layer, a p-metal work function layer, and a fill material.

The capping layer may be formed adjacent to the gate dielectric 1001 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

Once the openings left behind by the removal of the dummy gate electrodes 213 have been filled, the materials of the gate electrodes 1003 and the gate dielectric 1001 may be planarized in order to remove the materials of the gate electrodes 1003 and the gate dielectric 1001 that is outside of the openings. In a particular embodiment the removal may be performed using a planarization process such as chemical mechanical polishing, although any suitable planarization and removal process may be utilized.

Once formed, an optional recessing process may be performed to recess the gate electrodes 1003 below the planarized surfaces of the interlayer dielectric layer 803. The optional recessing process may be performed using an etching process such as a wet etch, a dry etch, combinations, or the like. Once recessed, optional gate caps (not shown) may be formed in the recesses by initially depositing a dielectric material over the gate electrodes 1003 to fill and/or overfill the recesses. In some embodiments, the optional gate caps are formed using a dielectric material such as a silicon nitride (SiN), oxide (OX), silicon oxynitride (SiON), silicon oxycarbonitride (SiOCN), silicon carbonitride (SiCN), or the like. According to some embodiments, the optional gate caps are formed using a metal oxide of materials such as zirconium (Zr), hafnium (Hf), aluminium (Al), or the like. Furthermore, the optional gate caps may be formed using a suitable deposition process such as chemical vapor deposition (CVD), atomic layer deposition (ALD), physical vapor deposition (PVD), combinations of these, or the like. However, any suitable materials and deposition processes may be utilized. Once deposited, the optional gate caps may be planarized, the spacers 219, the contact etch stop layer 801, and the interlayer dielectric layer 803 using a planarization process such as a chemical mechanical polishing process.

FIG. 10 further illustrates the formation of source/drain contacts 1005 for connectivity to the multi-structure source/drain regions 703, in accordance with some embodiments. Once the interlayer dielectric layer 803 has been formed, the source/drain contacts 1005 may be formed through the interlayer dielectric layer 803 and the contact etch stop layer 801 to make electrical connection to the multi-structure source/drain regions 703. In an embodiment the source/drain contacts 1005 may be formed by initially forming openings through the interlayer dielectric layer 803 and the contact etch stop layer 801 in order to expose the multi-structure source/drain regions 703. The openings may be formed using, e.g., a suitable photolithographic masking and etching process.

According to some embodiments, an optional silicidation process may be performed using appropriate materials such as titanium, nickel, cobalt, or erbium in order to reduce the Schottky barrier height of the source/drain contacts 1005. However, other metals, such as platinum, palladium, and the like, may also be used for the optional silicidation process. In some embodiments, the optional silicidation process is performed using a blanket deposition of an appropriate metal layer in the openings and over the exposed areas of the multi-structure source/drain regions 703. The blanket deposition is followed by an annealing step which causes the metal layer to react with the underlying exposed material (e.g., silicon) of the multi-structure source/drain regions 703. Un-reacted metal is then removed, such as with a selective etch process. According to some embodiments, the optional silicide contacts are formed to a thickness of between about 5 nm and about 50 nm. However, any suitable thickness may be used.

The source/drain contacts 1005 may be formed by depositing a conductive material such as W, Al, Cu, Co, Ti, Ta, Ru, TiN, TiAl, TiAlN, TaN, TaC, NiSi, CoSi, combinations of these, or the like, into the openings and over the exposed areas of the multi-structure source/drain regions 703 or over the optional silicide contacts (if present). The conductive material may be deposited using a process such as sputtering, chemical vapor deposition, electroplating, electroless plating, or the like, to fill and/or overfill the openings. Once filled or overfilled, any conductive material deposited outside of the openings may be removed using a planarization process such as chemical mechanical polishing (CMP). However, any suitable deposition process and planarization process may be utilized.

Further interlayer dielectric layers (not individually illustrated) and conductive features (also not individually illustrated) may be formed over the gate electrodes 1003 and/or the source/drain contacts 1005 to provide further external connectivity to the first semiconductor device 1000. Examples of further conductive features include but are not limited to, conductive vias, contact plugs, redistribution layers, contact traces, integrated passive devices, under bump metallization layers, and external contacts. However, any suitable dielectric layers and/or conductive features may be utilized and all such features are fully intended to be included within the scope of the embodiments.

FIG. 10 further illustrates a cutline B-B taken through the first semiconductor device 1000. Cutline B-B represents a vertical cut taken through the center of the gate electrode 1003, the nanostructures 313, the fin 207, and the substrate 101. The cutline B-B is oriented perpendicular to the lengths of the nanostructures 313 and the fin 207 and is used in reference with the following figures and descriptions.

Figure 11:
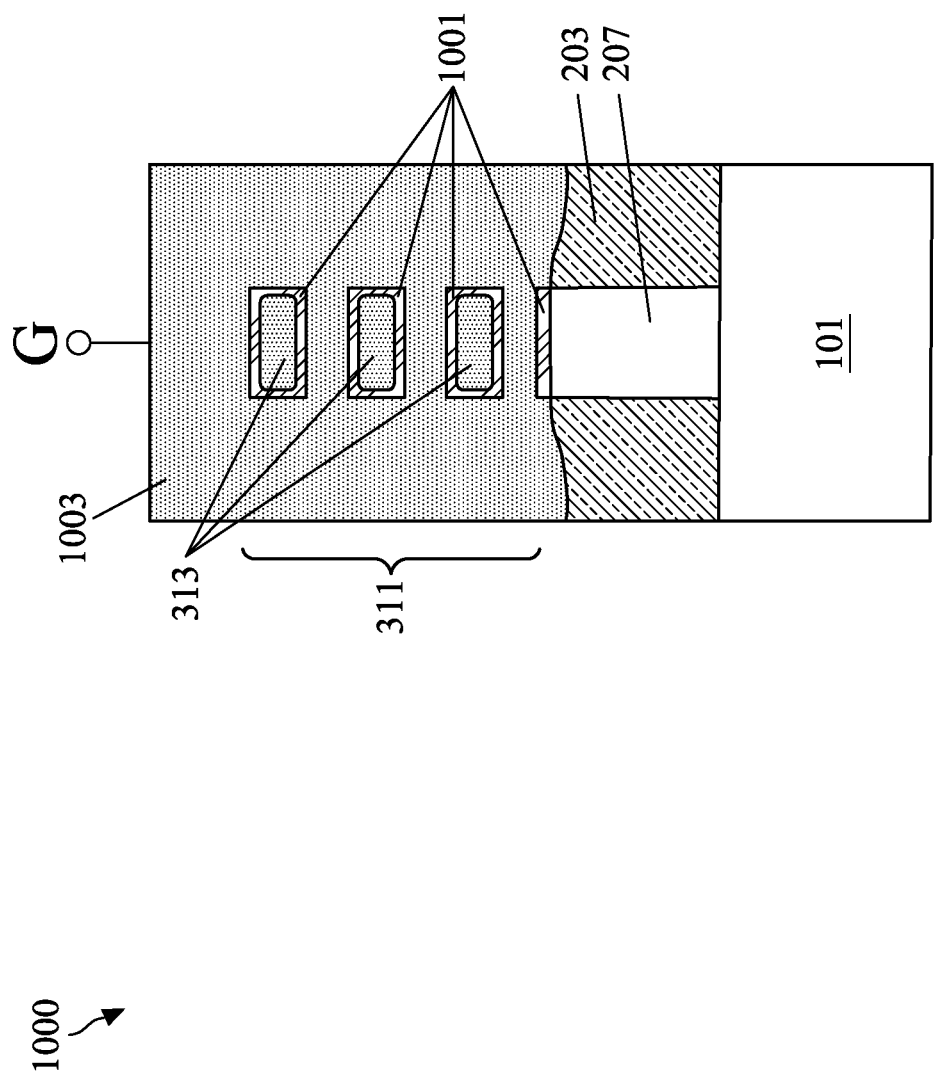

FIG. 11 illustrates a cross-sectional view through the vertical cutline B-B of the first semiconductor device 1000 illustrated in FIG. 10. In particular, FIG. 11 illustrates the nanostructure stacks 311 disposed over the fin 207 and the substrate 101. FIG. 11 further illustrates the gate dielectric 1001 surrounding each of the nanostructures 313 and overlying the fin 207. As such, the nanostructures 313 serve as gate-all-around channels of the first semiconductor device 1000. FIG. 11 further illustrates the gate electrode 1003 disposed over the isolation regions 203 and over and surrounding the gate dielectric 1001. As such, the gate electrode 1003 serves as a gate-all-around electrode of the first semiconductor device 1000.

Figure 12:
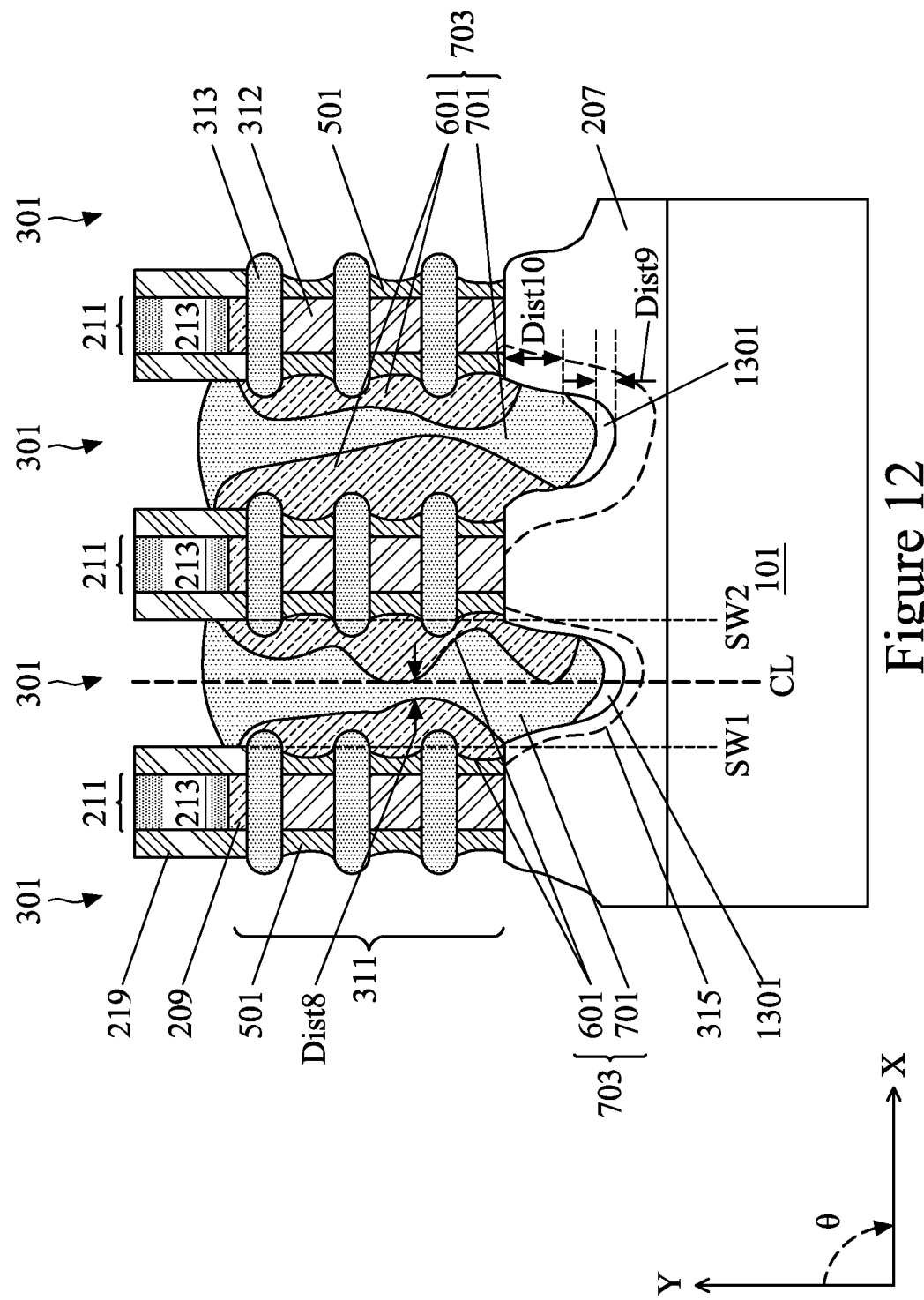
FIG. 12 illustrates a cross-sectional view of a second semiconductor device, in accordance with some embodiments.

FIG. 12 illustrates a cross-sectional view of a second semiconductor device, in accordance with some embodiments. FIG. 12 is similar to FIG. 7 except air gaps 1301 have been formed in place of the bottom S/D spacers 503.

According to some embodiments, the air gaps 1301 are formed by initially removing the bottom S/D spacers 503 prior to forming the first source/drain structures 601. In such embodiments, the recess removal process 550 may be controlled to recess and/or shape the inner spacers 501 and remove the bottom S/D spacers 503.

In other embodiments, the air gaps 1301 are formed by initially removing the bottom S/D spacers 503 after forming the first source/drain structures 601. In such embodiments, the first deposition process 650 is controlled to form the first source/drain structures 601 along the sidewalls of the first openings 301 and may be merged together to substantially cover the inner spacers 501 but remain separated along the centerline CL of the first opening 301. In some embodiments, an optional etching process may be used to recess the first source/drain structures 601 to increase the distance (e.g., the eighth distance Dist8) of the gap between the source/drain regions 601 formed along the first sidewall SW1 and the source/drain regions 601 formed along the second sidewall SW2. In some embodiments, the first source/drain structures 601 are recessed to a percentage between about 5% and about 20% of the volume of the source/drain region 703. In embodiments, where the entire volume of the first opening 301 is initially filled with the materials of the first source/drain structures 601, the source/drain material (e.g., SiGe) having the first percentage concentration by volume of germanium (Ge %$_1$) may be used. As such, an easy process may be used in the formation of the nanostructures 313. Once the nanostructures 313 have been formed, the first source/drain structures 601 may then be recessed to a desired volume leaving ample space for the materials of the second source/drain structures 701 to be deposited. By forming the first source/drain structures 601 to at least about 5% of the volume of multi-structure source/drain region 703 provides for a graded layer between a lattice mismatch between the materials of the nanostructures 313 (e.g., Si) and the materials to be used in the formation of the second source/drain structures 701 (e.g., SiGe) having the second percentage concentration by volume of germanium (Ge %$_2$). By restricting the volume of the first source/drain structures 601 to less than about 20%, allows sufficient remaining space within the opening 301 for the second source/drain structures 701 to be formed. As such, a low contact resistance of the multi-structure source/drain region 703 may be formed within the opening 301. As such, the first source/drain structures 601 protect the inner spacers 501 during removal of the bottom S/D spacers 503. The bottom S/D spacers 503 may be removed using a suitable etching process (e.g., wet etch, dry etch, reactive ion etching (RIE), or the like). Etching precursors that are selective to the materials of the bottom S/D spacers 503 and are substantially unselective to the materials of the first source/drain structures 601 may be used. According to some embodiments, plasma sources such as $CF_4$, $CH_3F$, HBr, $O_2$, He, Ar, combinations, or the like may be used in an anisotropic dry etching process for the selective removal of the bottom S/D spacers 503 without substantially removing materials of the first source/drain structures 601. However, any suitable etching precursors and process may be used.

Once the bottom S/D spacers 503 have been removed, the second source/drain structures 701 may be formed, by initially rotating the intermediate structure. Once rotated, a bottom-up deposition process may be performed to form the second source/drain structures 701. According to some embodiments, the intermediate structure is rotated from the illustrated vertical position to an angle θ of between about 45° and about 90°. By rotating the intermediate structure and tuning the flow rates of the precursors used in the second deposition process 750, deposition of the material of the second source/drain structures 701 in the bottom-up process allows for the materials to be grown along the surface of the first source/drain structures 601 from one sidewall to the other sidewall. For example, with the intermediate structure illustrated in FIG. 12 rotated through an angle θ of between about 45° and about 90°, the materials of the second source/drain structures 701 grow from the surface of the first source/drain structures 601 at the second sidewall SW2 to the surface of the first source/drain structures 601 at the first sidewall SW1. As such, the distance of the gap (e.g., eighth distance Dist8) begins to close between the first source/drain structures 601 at the second sidewall SW2 and the first sidewall SW1 which will eventually cause the material to pinch off so that the air gaps 1301 are formed below the second source/drain structures 701. The deposition behaviors of a CVD process are highly affected by a surface orientation of the multi-layer structure 100. For example, using an angle θ that is about 90°, a growth rate of the source/drain material (e.g., SiGe) is relatively slow as compared to a growth rate of the source/drain material using an angle θ of about 0°. Furthermore, epitaxial growth of the source/drain material tends to grow in a bottom-up fashion. As such, the relatively slow growth rate and growth in the bottom-up fashion when using an angle θ between about 45° and about 90° allows for formation of the air gap 1301. By using an angle θ that is less than about 45° may allow the second source/drain structures 701 to form from the bottom of the openings 301 without the air gap 1301 being formed. By using an angle θ that is greater than about 90° may allow the second source/drain structures 701 to form from the top of the openings 301 without forming along the entire exposed surface of the first source/drain structures 601. As such, the desired strain may not be provided to the nanostructures 313. According to some embodiments, the air gaps 1301 separate the second source/drain structures 701 from the bottoms of the first openings 301 by a ninth distance Dist9. Depending on the depth of the opening 301 into the fin 207, the ninth distance Dist9 may be a distance of between about 0.5 nm and about 20 nm, allowing for formation of a device having reduced AC and improved short channel effect (SCE). By ensuring the ninth distance Dist9 of the air gap 1301 is at least about 0.5 nm allows for greater AC reduction of the device being formed. By ensuring the ninth distance Dist9 of the air gap 1301 is less than about 20 nm, allows for greater strain efficiency of the multi-structure source/drain region 703 being formed. Furthermore, a top of the air gap 1301 is a tenth distance Dist10 from the top of the fins 207. According to some embodiments and depending on the fourth depth D4 of the opening 301 into the fin 207, the tenth distance Dist10 is a distance of between about 1.5 nm and about 80 nm from a top of the fin 207. By ensuring the tenth distance Dist10 is greater than about 1.5 nm from the top of the fin 207, allows for epitaxial growth of the materials of the multi-structure source/drain region 703 to be formed along a greater portion of the fin 207. As such, a device may be formed with improved strain efficiency. For embodiments in which the first openings 301 are formed up to 100 nm into the fin 207, a height of the air gap 1301 is maintained by ensuring the tenth distance Dist10 is less than about 80 nm. For embodiments in which the openings are formed up to about 25 nm into the fin 207, a height of the air gap 1301 is maintained by ensuring the tenth distance Dist10 is less than about 20 nm. In such embodiments, a device may be formed with improved AC performance. However, any suitable distances may be used for the ninth distance Dist9 and the tenth distance Dist10.

By utilizing the methods and structures presented herein, more robust manufacturing processes may be utilized to improve device performance, prevent damage during the wire release process, and reduce parasitic capacitance. In particular, the first source/drain structures 601 are formed using a low concentration percentage of germanium (e.g., similar to the first concentration percentage of germanium Ge %$_1$, where 10%≤Ge %$_1$<30%) and the second source/drain structures 701 are formed using a high concentration percentage of germanium (e.g., similar to the second concentration percentage of germanium Ge %$_2$, where 30%≤Ge %$_2$≤65%). The bottom S/D spacers 503 allow for a high volume ratio of the second source/drain structures 701 to the first source/drain structures 601 which provides a strong channel strain for improved device performance. In addition, the bottom S/D spacers 503 and/or the air gaps 1301 have low dielectric constants which reduces a parasitic capacitance between neighboring multi-structure source/drain regions 703. Forming the multi-structure source/drain regions 703 to have a high volume of the second source/drain structures 701 also reduces the risk of source/drain EPI damage due to removal of the dummy gate electrode 213 and/or removal of the dummy gate dielectric 209.

In an embodiment, a method includes: forming an opening through a multilayer stack and into a substrate; depositing a first semiconductor material, the first semiconductor material has a first percentage volume of germanium; depositing a second semiconductor material adjacent to the first semiconductor material, the second semiconductor material being deposited below a bottommost surface of the first semiconductor material, the second semiconductor material has a second percentage volume of germanium that is greater than the first percentage volume of germanium; and removing sacrificial layers of the multilayer stack, the second semiconductor material being electrically coupled to a stack of nanostructures. In an embodiment, the method further includes, prior to depositing the first semiconductor material, forming a bottom spacer at a bottom of the opening, wherein the second semiconductor material forms an interface with the bottom spacer. In an embodiment of the method, wherein the depositing the first semiconductor material includes forming a first source/drain structure adjacent a first nanostructure of the stack of nanostructures and forming a second source/drain structure adjacent a second nanostructure of the stack of nanostructures, the first source/drain structure remaining unmerged with the second source/drain structure. In an embodiment of the method, wherein the depositing the second semiconductor material includes forming an air gap at a bottom of the opening. In an embodiment, the method further includes: prior to the depositing the first semiconductor material, depositing a dielectric material in the opening; forming an inner spacer between a first nanostructure and a second nanostructure of the stack of nanostructures from the dielectric material; and after the depositing the first semiconductor material, removing excess dielectric material at the bottom of the opening using the first semiconductor material to protect the inner spacer. In an embodiment of the method, wherein depositing the first semiconductor material includes forming a first source/drain structure adjacent to the first nanostructure and forming a second source/drain structure adjacent to the second nanostructure, the first source/drain structure merging with the second source/drain structure. In an embodiment of the method, the second percentage volume of germanium is within the range of 30% and 65%, inclusive.

In another embodiment of the method, a method includes: forming a multilayer structure over a substrate; forming an opening in the multilayer structure and exposing a first layer of the multilayer structure along a sidewall of the opening; forming a first source/drain structure adjacent the first layer; and forming a second source/drain structure over the first source/drain structure, the second source/drain structure including a greater percentage by volume germanium than the first source/drain structure, a portion of the second source/drain structure being located between a bottommost portion of the first source/drain structure and the substrate. In an embodiment, the method further includes, prior to forming the first source/drain structure, depositing a dielectric material at a bottom of the opening, wherein the second source/drain structure forms an interface with the dielectric material. In an embodiment of the method, wherein the exposing the first layer includes exposing a second layer of the multilayer structure along the sidewall of the opening, the method further includes forming a third source/drain structure adjacent the second layer, wherein after the forming the third source/drain structure, the second source/drain structure is interposed between the first source/drain structure and the third source/drain structure. In an embodiment of the method, wherein after the forming the second source/drain structure a gap remains between the bottommost portion of the first source/drain structure and a bottom of the opening. In an embodiment, the method further includes: prior to the forming the first source/drain structure, depositing a dielectric material in the opening; forming an inner spacer from the dielectric material, the inner spacer being between the first layer and a second layer of the multilayer structure; and, after the forming the first source/drain structure, removing the dielectric material at the bottom of the opening. In an embodiment of the method, the forming the first source/drain structure further includes forming the first source/drain structure adjacent the second layer and the inner spacer. In an embodiment of the method, a percentage by volume of germanium of the first source/drain structure is less than 30% and greater than or equal to 10%.

In an embodiment, a semiconductor device includes: a first multilayer channel over a substrate; and a source/drain region, wherein the source/drain region includes: a first structure interfacing the first multilayer channel, the first structure including a first semiconductor material with a first volume concentration of germanium; and a second structure interfacing the first structure, the second structure including a second semiconductor material with a second volume concentration of germanium, the second volume concentration of germanium being greater than the first volume concentration of germanium and wherein a bottom of the second structure is located below a bottommost surface of the first structure. In an embodiment, the semiconductor device further includes a third structure interfacing a second channel of the first multilayer channel, the second structure being located between the first structure and the third structure. In an embodiment, the semiconductor device further includes a dielectric bottom spacer embedded in the substrate, wherein the bottom of the second structure is in physical contact with the dielectric bottom spacer. In an embodiment of the semiconductor device, the first volume concentration of germanium is less than 30% and greater than or equal to 10%. In an embodiment, the semiconductor device further includes an air gap disposed between the bottom of the second structure and the substrate. In an embodiment of the semiconductor device, the first structure interfaces a first channel of the first multilayer channel and also interfaces a second channel of the first multilayer channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an opening through a multilayer stack and into a substrate;
    depositing a first semiconductor material, the first semiconductor material comprising a first percentage volume of germanium;
    depositing a second semiconductor material adjacent to the first semiconductor material, the second semiconductor material being deposited below a bottommost surface of the first semiconductor material, the second semiconductor material comprising a second percentage volume of germanium that is greater than the first percentage volume of germanium;
    removing sacrificial layers of the multilayer stack, the second semiconductor material being electrically coupled to a stack of nanostructures;
    prior to the depositing the first semiconductor material, depositing a dielectric material in the opening;
    forming an inner spacer between a first nanostructure and a second nanostructure of the stack of nanostructures from the dielectric material; and
    after the depositing the first semiconductor material, removing excess dielectric material at the bottom of the opening using the first semiconductor material to protect the inner spacer.

2. The method of claim 1, further comprising, prior to depositing the first semiconductor material, forming a bottom spacer at a bottom of the opening, wherein the second semiconductor material forms an interface with the bottom spacer.

3. The method of claim 2, wherein the depositing the first semiconductor material comprises forming a first source/drain structure adjacent a first nanostructure of the stack of nanostructures and forming a second source/drain structure adjacent a second nanostructure of the stack of nanostructures, the first source/drain structure remaining unmerged with the second source/drain structure.

4. The method of claim 1, wherein the depositing the second semiconductor material comprises forming an air gap at a bottom of the opening.

5. The method of claim 1, wherein depositing the first semiconductor material comprises forming a first source/drain structure adjacent to the first nanostructure and forming a second source/drain structure adjacent to the second nanostructure, the first source/drain structure merging with the second source/drain structure.

6. The method of claim 1, wherein the second percentage volume of germanium is within the range of 30% and 65%, inclusive.

7. The method of claim 1, wherein the dielectric material comprises silicon oxycarbonitride.

8. A method comprising:
    forming a multilayer structure over a substrate;
    forming an opening in the multilayer structure and exposing a first layer of the multilayer structure along a sidewall of the opening;
    forming a first source/drain structure adjacent the first layer;
    forming a second source/drain structure over the first source/drain structure, the second source/drain structure comprising a greater percentage by volume germanium than the first source/drain structure, a portion of the second source/drain structure being located between a bottommost portion of the first source/drain structure and the substrate;
    prior to the forming the first source/drain structure, depositing a dielectric material in the opening;
    forming an inner spacer from the dielectric material, the inner spacer being between the first layer and a second layer of the multilayer structure; and
    after the forming the first source/drain structure, removing the dielectric material at the bottom of the opening.

9. The method of claim 8, wherein the second source/drain structure forms an interface with the dielectric material.

10. The method of claim 9, wherein the exposing the first layer comprises exposing a second layer of the multilayer structure along the sidewall of the opening, the method further comprising forming a third source/drain structure adjacent the second layer, wherein after the forming the third source/drain structure, the second source/drain structure is interposed between the first source/drain structure and the third source/drain structure.

11. The method of claim 8, wherein after the forming the second source/drain structure a gap remains between the bottommost portion of the first source/drain structure and a bottom of the opening.

12. The method of claim 8, wherein the forming the first source/drain structure further comprises forming the first source/drain structure adjacent the second layer and the inner spacer.

13. The method of claim 8, wherein a percentage by volume of germanium of the first source/drain structure is less than 30% and greater than or equal to 10%.

14. The method of claim 8, wherein the depositing the dielectric material deposits the dielectric material to a thickness of between about 2 nm and about 10 nm.

15. A semiconductor device comprising:
    a first multilayer channel over a substrate; and a source/drain region, wherein the source/drain region comprises:
   a first structure interfacing the first multilayer channel, the first structure comprising a first semiconductor material with a first volume concentration of germanium; and
   a second structure interfacing the first structure, the second structure comprising a second semiconductor material with a second volume concentration of germanium, the second volume concentration of germanium being greater than the first volume concentration of germanium and wherein a bottom of the second structure is located below a bottommost surface of the first structures, wherein the first structure interfaces a first channel of the first multilayer channel and also interfaces a second channel of the first multilayer channel.

16. The semiconductor device of claim 15, further comprising a third structure interfacing a second channel of the first multilayer channel, the second structure being located between the first structure and the third structure.

17. The semiconductor device of claim 16, further comprising a dielectric bottom spacer embedded in the substrate, wherein the bottom of the second structure is in physical contact with the dielectric bottom spacer.

18. The semiconductor device of claim 15, wherein the first volume concentration of germanium is less than 30% and greater than or equal to 10%.

19. The semiconductor device of claim 15, further comprising an air gap disposed between the bottom of the second structure and the substrate.

20. The semiconductor device of claim 15, wherein the dielectric spacer comprises silicon nitride.

* * * * *